(12) United States Patent
Govindaraju et al.

(10) Patent No.: US 11,963,285 B2
(45) Date of Patent: Apr. 16, 2024

(54) TARGET MATERIAL CONTROL IN AN EUV LIGHT SOURCE

(71) Applicant: ASML Netherlands B.V., Veldhoven (NL)

(72) Inventors: Abhiram Lakshmi Ganesh Govindaraju, San Diego, CA (US);
David Bessems, San Diego, CA (US);
Sandeep Rai, Corona, CA (US); Petrus Adrianus Willems, Eindhoven (NL);
Serkan Kincal, San Diego, CA (US);
Joshua Mark Lukens, San Diego, CA (US); Jon David Tedrow, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 349 days.

(21) Appl. No.: 17/435,861

(22) PCT Filed: Mar. 9, 2020

(86) PCT No.: PCT/EP2020/056144
§ 371 (c)(1),
(2) Date: Sep. 2, 2021

(87) PCT Pub. No.: WO2020/187617
PCT Pub. Date: Sep. 24, 2020

(65) Prior Publication Data
US 2022/0159817 A1 May 19, 2022

Related U.S. Application Data

(60) Provisional application No. 62/951,577, filed on Dec. 20, 2019, provisional application No. 62/842,453,
(Continued)

(51) Int. Cl.
*H05G 2/00* (2006.01)
*G03F 7/00* (2006.01)

(52) U.S. Cl.
CPC ......... *H05G 2/006* (2013.01); *G03F 7/70033* (2013.01); *H05G 2/008* (2013.01)

(58) Field of Classification Search
CPC ..... H05G 2/006; H05G 2/008; G03F 7/70033
(Continued)

(56) References Cited

U.S. PATENT DOCUMENTS 7,122,816 B2   10/2006   Algots et al.
8,154,000 B2    4/2012   Hergenhan et al.
(Continued)

FOREIGN PATENT DOCUMENTS

CN   106233449 A   12/2016
JP   2008532228 A   8/2008
(Continued)

OTHER PUBLICATIONS

Christopher Smith, European International Searching Authority, International Search Report and Written Opinion, counterpart PCT Application No. PCT/EP2020/056144, dated Jun. 26, 2020, 10 pages total.

*Primary Examiner* — Kiet T Nguyen
(74) *Attorney, Agent, or Firm* — DiBerardino McGovern IP Group LLC

(57) ABSTRACT

Provided is an apparatus that includes a first reservoir system including a first fluid reservoir configured to be in fluid communication with a nozzle supply system during operation of the nozzle supply system, a second reservoir system including a second fluid reservoir configured to be, at least part of the time during operation of the nozzle supply system, in fluid communication with the first reservoir system, a priming system configured to produce a fluid
(Continued)

target material from a solid matter, and a fluid control system fluidly connected to the priming system, the first reservoir system, the second reservoir system, and the nozzle supply system. The fluid control system is configured to, during operation of the nozzle supply system: isolate at least one fluid reservoir and the nozzle supply system from the priming system, and maintain a fluid flow path between at least one fluid reservoir and the nozzle supply system.

40 Claims, 20 Drawing Sheets

Related U.S. Application Data filed on May 2, 2019, provisional application No. 62/819,366, filed on Mar. 15, 2019.

(58) Field of Classification Search
USPC .................................................. 250/504 R
See application file for complete search history.

(56) References Cited

U.S. PATENT DOCUMENTS

| | | | |
|---|---|---|---|
| 10,331,035 | B2 | 6/2019 | Lai et al. |
| 10,495,974 | B2 | 12/2019 | Tsai |
| 2006/0192155 | A1 | 8/2006 | Algots et al. |
| 2010/0282987 | A1 | 11/2010 | Hergenhan et al. |
| 2012/0292527 | A1* | 11/2012 | Fomenkov ............ B01D 29/56 |
| | | | 250/428 |
| 2013/0153603 | A1 | 6/2013 | De Dea et al. |
| 2014/0261761 | A1 | 9/2014 | Vaschenko et al. |
| 2015/0314325 | A1 | 11/2015 | Ko et al. |
| 2018/0368242 | A1* | 12/2018 | Winkels ................. H05G 2/006 |

FOREIGN PATENT DOCUMENTS

| | | |
|---|---|---|
| JP | 2010263210 A | 11/2010 |
| JP | 2016512381 A | 4/2016 |
| WO | 2006093782 A2 | 9/2006 |

* cited by examiner

TARGET MATERIAL CONTROL IN AN EUV LIGHT SOURCE

CROSS REFERENCE TO RELATED APPLICATIONS

This application claims priority to U.S. Application No. 62/819,366, filed on Mar. 15, 2019 and titled CONTINUOUS DROPLETS WHILE MAKING EUV WITH INLINE TARGET MATERIAL REFILL. This application also claims priority to U.S. Application No. 62/842,453, filed on May 2, 2019 and titled METHOD AND SYSTEM FOR EUV PRODUCTION WITH CONTINUOUS DROPLET STREAM AND INLINE TARGET MATERIAL REFILL. This application also claims priority to U.S. Application No. 62/951,577, filed on Dec. 20, 2019 and titled TARGET MATERIAL CONTROL IN AN EUV LIGHT SOURCE. All of these applications are incorporated herein in their entireties by reference.

TECHNICAL FIELD

The disclosed subject matter relates to an apparatus and method for controlling the supply of a target material in an Extreme Ultraviolet (EUV) light source.

BACKGROUND

Extreme ultraviolet ("EUV") light, for example, electromagnetic radiation having wavelengths of around 50 nanometers (nm) or less (also sometimes referred to as soft x-rays), and including light at a wavelength of about 13 nm, is used in photolithography processes to produce extremely small features in and on substrates, for example, silicon wafers, that are used to produce integrated circuits and various other microelectronic devices.

Methods for generating EUV light include, but are not limited to, altering the physical state of a source material to a plasma state. The source material includes a compound or an element, for example, xenon, lithium, or tin, with an emission line in the EUV range. In one such method, often termed laser produced plasma ("LPP"), the required plasma is produced by irradiating a source material, for example, in the form of a droplet, stream, or cluster of source material, with an amplified light beam that can be referred to as a drive laser. For this process, the plasma is typically produced in a sealed vessel, for example, a vacuum chamber, and monitored using various types of metrology equipment. The source material, such as xenon, lithium, or tin, which emit in the EUV range when in the plasma state, are commonly referred to as target material since they are targeted and irradiated by the drive laser.

SUMMARY

In some general aspects, an apparatus is configured to supply a target material. The apparatus includes: a first reservoir system, a second reservoir system, a priming system, and a fluid control system. The first reservoir system includes a first fluid reservoir configured to be in fluid communication with a nozzle supply system during operation of the nozzle supply system, the first fluid reservoir maintained at a first pressure. The second reservoir system includes a second fluid reservoir configured to be, at least part of the time during operation of the nozzle supply system, in fluid communication with the first reservoir system. The priming system is configured to receive a solid matter that includes a target material and to produce a fluid target material from the solid matter, the priming system maintained at a priming pressure that is less than the first pressure. The fluid control system is fluidly connected to the priming system, the first reservoir system, the second reservoir system, and the nozzle supply system. The fluid control system is configured to: isolate at least one fluid reservoir and the nozzle supply system from the priming system during operation of the nozzle supply system, and maintain a fluid flow path between at least one fluid reservoir and the nozzle supply system during operation of the nozzle supply system.

Implementations can include one or more of the following features. For example, the priming pressure can be less than about 600 kilopascals (kPa). The first pressure can be at least 6000 kPa, at least 10,000 kPA, at least 25,000 kPA, or in a range of about 6000-60,000 kPa.

While the second fluid reservoir is being refilled with fluid target material from the priming system, the priming system and the second fluid reservoir can be maintained at the priming pressure and the priming system and the second fluid reservoir can be positioned relative to each other such that the second fluid reservoir is prevented from overfilling with the fluid target material.

The fluid control system can be configured to, while the second fluid reservoir is being refilled with fluid target material from the priming system, maintain the fluid flow path between the first fluid reservoir and the nozzle supply system during operation of the nozzle supply system. The fluid control system can be configured to clear a target fluid material from each interface defined between the first fluid reservoir, the second fluid reservoir, the priming system, and the nozzle supply system.

The fluid control system can be configured to maintain the fluid flow path between at least one fluid reservoir and the nozzle supply system during operation of the nozzle supply system by maintaining the fluid flow path between the first fluid reservoir and the nozzle supply system and between the second fluid reservoir and the nozzle supply system during operation of the nozzle supply system and while maintaining the nozzle supply system and the second fluid reservoir at the first pressure. The fluid control system can be further configured to maintain the fluid flow path between the at least one fluid reservoir and the nozzle supply system during operation of the nozzle supply system and enabling the fluid flow path between the first fluid reservoir and the second fluid reservoir.

The apparatus can also include an environment control apparatus configured to: independently and separately control the first pressure in the first fluid reservoir and a second pressure in the second fluid reservoir, and independently and separately control a temperature of the first fluid reservoir and a temperature of the second fluid reservoir. The environment control apparatus can be further configured to adjust or reset the second pressure of the second fluid reservoir based on a measured amount of fluid target material within the second fluid reservoir. The environment control apparatus can include a pressurized reservoir configured to contain an inert gas and to transfer inert gas from the pressurized reservoir to one or more of the first fluid reservoir and the second fluid reservoir through an orifice.

The fluid control system can include a reservoir fluid control valve between the first fluid reservoir and the second fluid reservoir and a refill fluid control valve between the second fluid reservoir and the priming system. The fluid control system can be configured to independently control the reservoir fluid control valve and the refill fluid control valve. The reservoir fluid control valve can include a freeze valve and the refill fluid control valve can include a freeze valve.

The fluid control system can be further configured to maintain the fluid flow path between the first fluid reservoir and the second fluid reservoir during operation of the nozzle supply system.

The second fluid reservoir can be configured to be, at least part of the time during operation of the nozzle supply system, in fluid communication with the nozzle supply system.

The priming system can include: a first chamber including a door that is configured to open so that solid matter can be received within a first volume defined by the first chamber; a second chamber defining a second volume and being in fluid communication with the fluid control system; and a flow blocking device formed in an otherwise unobstructed fluid path between the first chamber and the second chamber. The flow blocking device can be a freeze valve in which a fluid flow path is blocked by the solid matter when maintained at a temperature below the melting point of the solid matter.

The apparatus can also include a sensing system configured to estimate a volume of the fluid target material in one or more of the first fluid reservoir, the second fluid reservoir, and the priming system and/or a presence of solid matter within the priming system. The apparatus can include a control system in communication with the sensing system, the control system being configured to determine a consumption rate of the fluid target material in the second fluid reservoir, the consumption rate being the amount of the fluid target material used per a time period, based on the output from the high pressure transducer. The sensing system can include a high pressure transducer associated with one or more of the first fluid reservoir and the second fluid reservoir.

The fluid control system can be configured to maintain the fluid flow path between at least one fluid reservoir and the nozzle supply system during operation of the nozzle supply system by maintaining the fluid flow path between the first fluid reservoir and the nozzle supply system during operation of the nozzle supply system and while maintaining the nozzle supply system at the first pressure.

In other general aspects, a method is performed for continuously supplying a target material in an uninterrupted manner. The method includes receiving a solid matter that includes a target material in a priming system maintained at a priming pressure and producing a fluid target material from the solid matter. The method includes maintaining fluid communication between a first fluid reservoir and a nozzle supply system during operation of the nozzle supply system while maintaining the first fluid reservoir at a first pressure that is greater than the priming pressure. The method includes, at least part of the time during operation of the nozzle supply system, enabling a transfer of fluid target material between the first fluid reservoir and a second fluid reservoir at the first pressure while the fluid target material is being produced in the priming system at the priming pressure.

Implementations can include one or more of the following features. For example, the method can include maintaining the first pressure of the first fluid reservoir while fluid target material is enabled to transfer between the priming system and the second fluid reservoir. The method can include enabling a transfer of fluid target material to the nozzle supply system throughout operation of the nozzle supply system by flowing fluid target material: from the first fluid reservoir to the nozzle supply system; from the second fluid reservoir to the nozzle supply system; or from the first fluid reservoir and the second fluid reservoir, simultaneously to the nozzle supply system. The method can include, at least some of the time during operation of the nozzle supply system, preventing fluid target material from being transferred to the second fluid reservoir and/or the first fluid reservoir. The method can include reloading solid matter that includes the target material into the priming system only when the priming system is at the priming pressure. Reloading solid matter that includes the target material into the priming system can occur while the nozzle supply system is at the first pressure.

The method can also include refilling the second fluid reservoir with fluid target material from the priming system while maintaining the first pressure of the first fluid reservoir and fluidly separating the second fluid reservoir from the priming system after enough fluid target material has been transferred into the second fluid reservoir from the priming system. The method can include maintaining the priming system and the second fluid reservoir at the priming pressure while the second fluid reservoir is being refilled with fluid target material from the priming system, and preventing the second fluid reservoir from overfilling with fluid target material.

The method can include clearing a target fluid material from each interface defined between the first fluid reservoir, the second fluid reservoir, the priming system, and the nozzle supply system prior to halting operation of the nozzle supply system and halting fluid communication between the first fluid reservoir and the nozzle supply system. The method can include melting the solid matter of target material in the priming system into the target fluid material.

Operation of the nozzle supply system can include delivering droplets of the fluid target material to an extreme ultraviolet (EUV) light source, where the droplets are configured to be irradiated with radiation to create a plasma that emits EUV light.

The method can include controlling a temperature and a pressure of the fluid target material in each of the first fluid reservoir, the second fluid reservoir, and the priming system in an independent and separate manner.

In other general aspects, a method includes receiving a solid matter that includes a target material in a priming system maintained at a priming pressure and producing a fluid target material from the solid matter; maintaining fluid communication between a first fluid reservoir and a nozzle supply system during operation of the nozzle supply system while maintaining the first fluid reservoir at a first pressure that is greater than the priming pressure; and enabling a transfer of the fluid target material between the priming system and a second fluid reservoir while fluidly isolating the first fluid reservoir and the nozzle supply system from the priming system.

Implementations can include one or more of the following features. For example, operation of the nozzle supply system can include delivering droplets of the fluid target material to an extreme ultraviolet (EUV) light source, where the droplets are configured to be irradiated with radiation to create a plasma that emits EUV light.

The method can include maintaining the first pressure of the first fluid reservoir while fluid target material is enabled to transfer between the priming system and the second fluid reservoir. The method can include enabling a transfer of the fluid target material between the second fluid reservoir and the first fluid reservoir while fluidly isolating the first fluid reservoir, the second fluid reservoir, and the nozzle supply system from the priming system.

The method can include enabling a transfer of fluid target material to the nozzle supply system throughout operation of the nozzle supply system by flowing fluid target material: from the first fluid reservoir to the nozzle supply system; from the second fluid reservoir to the nozzle supply system; or from the first fluid reservoir and the second fluid reservoir, simultaneously to the nozzle supply system.

The method can include, at least some of the time during operation of the nozzle supply system, preventing fluid target material from being transferred to the second fluid reservoir and/or the first fluid reservoir. The method can include reloading solid matter that includes the target material into the priming system only when the priming system is at the priming pressure. Reloading solid matter that includes the target material into the priming system can occur while the nozzle supply system is at the first pressure.

The method can include refilling the second fluid reservoir with fluid target material from the priming system while maintaining the first pressure of the first fluid reservoir. The method can include maintaining the priming system and the second fluid reservoir at the priming pressure while the second fluid reservoir is being refilled with fluid target material from the priming system, and preventing the second fluid reservoir from overfilling with fluid target material. The method can include fluidly separating the second fluid reservoir from the priming system after enough fluid target material has been transferred into the second fluid reservoir from the priming system.

The method can further include melting the solid matter of target material in the priming system into the target fluid material. The method can also include controlling a temperature and a pressure of the fluid target material in each of the first fluid reservoir, the second fluid reservoir, and the priming system in an independent and separate manner.

The method can also include clearing a target fluid material from each interface defined between the first fluid reservoir, the second fluid reservoir, the priming system, and the nozzle supply system prior to halting operation of the nozzle supply system and halting fluid communication between the first fluid reservoir and the nozzle supply system.

DESCRIPTION

Figure 1:
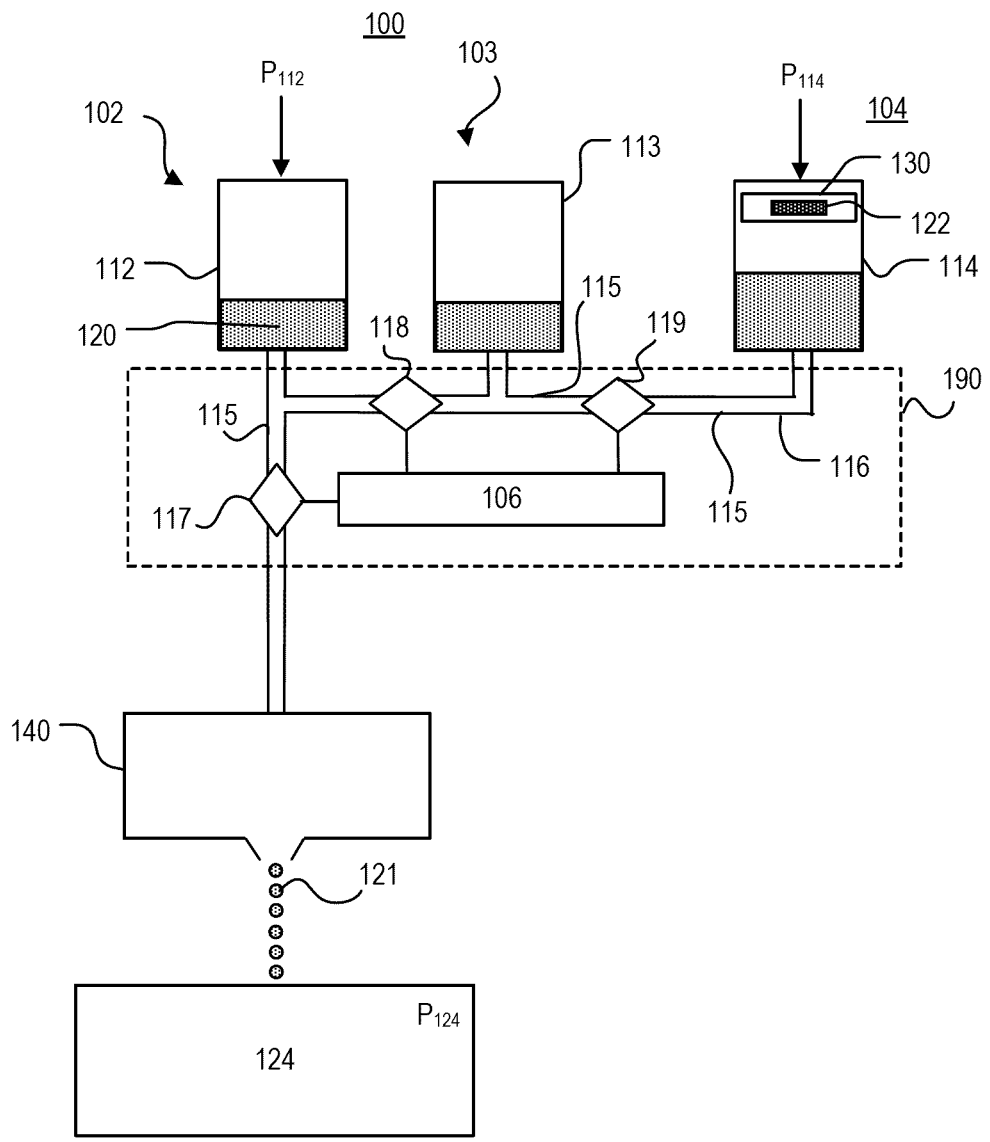
FIG. 1 is a block diagram of an apparatus including a first reservoir system, a second reservoir system, a priming system, and a fluid control system, and being configured to supply a nozzle supply system with a fluid target material during continuous operation of the nozzle supply system.

Referring to FIG. 1, an apparatus 100 is configured to supply a nozzle supply system 140 with a fluid target material 120 during continuous operation of the nozzle supply system 140. The nozzle supply system 140 can be configured to supply the fluid target material 120 in the form of a stream of targets 121 for use by a system 124. The fluid target material 120 is a target material that is in a fluid state (such as a liquid state).

The apparatus 100 includes a first reservoir system 102, a second reservoir system 103, a priming system 104, and a fluid control system 190. The fluid control system 190 is fluidly connected to the priming system 104, the first reservoir system 102, the second reservoir system 103, and the nozzle supply system 140. In some implementations, the fluid control system 190 includes a fluid communication apparatus 116 and a fluid controller 106 operable to adjust one or more aspects of the fluid communication apparatus 116.

The priming system 104 is configured to receive a solid matter 122 that includes the target material. The fluid communication apparatus 116 is an adjustable fluid flow path that is able to be in fluid communication with the first reservoir system 102, the second reservoir system 103, the priming system 104, and the nozzle supply system 140. For example, the fluid communication apparatus 116 includes fluid transmission lines 115 and one or more regulation devices 118 and 119 configured to regulate, direct, or control the flow of a fluid through the fluid transmission lines by, for example, opening, closing, or partially obstructing various passageways within the fluid transmission lines. The fluid communication apparatus 116 can also include a regulation device 117 along the fluid flow path toward the nozzle supply system 140 to control fluid flow to the nozzle supply system 140.

Because the apparatus 100 includes two reservoir systems 102, 103 in addition to the priming system 104 (which enables refill of the target material into the entire apparatus 100), the fluid target material 120 can be transferred between the first and second reservoir system 102, 103 while the solid matter 122 of the target material 120 is being added to the priming system 104. In particular, during operation of the nozzle supply system 140 to supply the stream of targets 121, the fluid control system 190 controls the fluid communication between and among the first reservoir system 102, the second reservoir system 103, and the priming system 104 to maintain a continuous supply of the fluid target material 120 to the nozzle supply system 140 so that the stream of targets 121 supplied to the system 124 is not interrupted.

Additionally, the actions that take place within the apparatus 100 do not adversely impact performance of the nozzle supply system 140 that could otherwise arise due to disturbances in fluid pressure. Moreover, in some implementations, while fluid is being supplied to the nozzle supply system 140, the first reservoir system 102 is in fluid communication with the nozzle supply system 140 and is also maintained at a high pressure, and the first reservoir system 102 can provide a primary source of fluid target material 120 to the nozzle supply system 140.

Fluid control between and among each of the first reservoir system 102, the second reservoir system 103, the priming system 104, and the nozzle supply system 140 can be independently controlled by the fluid control system 190, and in this way, at least one of the reservoir systems 102 or 103, which is in fluid communication with the nozzle supply system 140, can provide a source of fluid target material 120 to the nozzle supply system 140 at all times during operation of the nozzle supply system 140.

As discussed above, the fluid communication apparatus 116 includes the fluid transmission lines 115 and the one or more regulation devices 117, 118, 119 configured to regulate, direct, or control the flow of a fluid through the fluid transmission lines 115 by, for example, opening, closing, or partially obstructing various passageways within the fluid transmission lines 115. The fluid transmission lines 115 can include, for example, one or more interconnected tubings formed of tantalum tungsten (TaW) or other suitable materials that can contain the fluid target material 120 at varying and high pressures. The tubings can be flexible. The fluid communication apparatus 116 can include other various fluid control devices not shown that are configured to provide a controllable fluid flow path between the various parts of an apparatus 100. The fluid communication apparatus 116 can include (in addition to the noted fluid transmission lines 115 and one or more regulation devices 117, 118, 119) one or more valves, tubes, fluid flow regulation apparatuses, and tanks.

Each of the regulation devices 117, 118, 119 can include a valve control apparatus. In this way, fluid flow through a particular regulation device 117, 118, 119 can be adjusted by opening or closing the valve within its valve control apparatus. Each valve control apparatus can include a fluid valve, which can be, for example, a thermally-controlled valve, a manual valve, and/or a motor. In a thermally-controlled valve (which is also referred to as a freeze valve), the pathway is heated to maintain the fluid within the flow path in a liquid state, and the pathway is permitted to cool down or actively cooled to thereby convert the fluid into a solid state. Thus, in some implementations discussed herein, the valve control apparatus within regulation devices 118, 119 includes a freeze valve. Each valve control apparatus of the regulation device 117, 118, 119 can have any suitable shape, such as, for example, a 90° bent tubing, a restricted passage tubing, or a cylindrical tubing.

Figure 2:
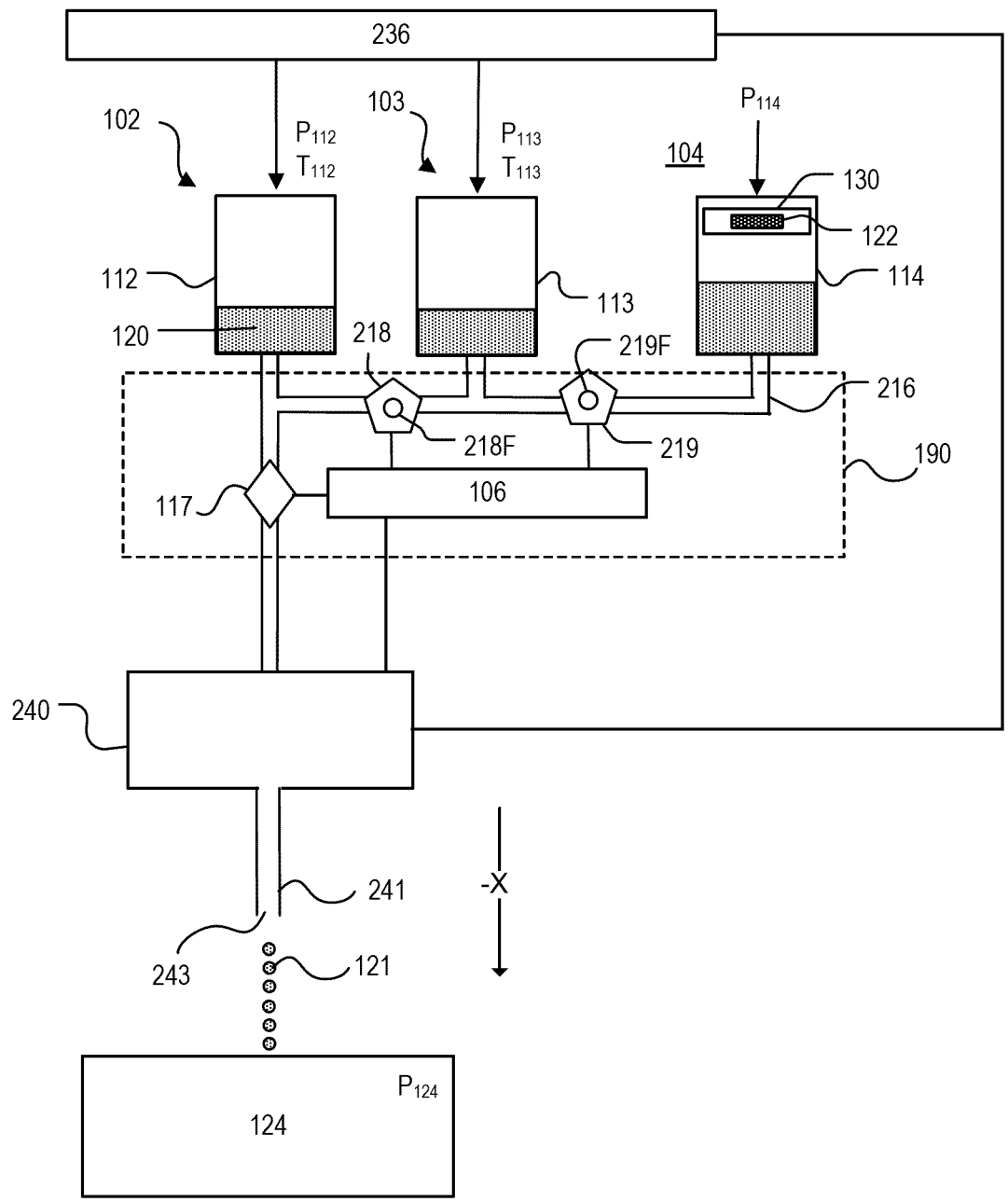
FIG. 2 is a block diagram of an implementation of the apparatus of FIG. 1, including an environment control apparatus and showing an implementation of the fluid control system.

Moreover, as shown in FIG. 2, the apparatus 100 can include an environment control apparatus 236 that is configured to independently control an environment (such as a temperature and a pressure) of each of the first reservoir system 102 and the second reservoir system 103. The environmental control of the first reservoir system 102 and the second reservoir system 103 can be performed independently of the environmental control of the priming system 104. In particular, the reloading of the solid matter 122 into the priming system 104 can be performed at a temperature below the melting point of the fluid target material 120 and at atmospheric pressure. At the same time, one or more of the reservoir system 102 or 103 is supplying fluid target material to the nozzle supply system 140. This is partly enabled by the fact that the priming system 104 can be environmentally separated from each of the reservoir systems 102, 103. Other benefits and features of the apparatus 100 are discussed below after a detailed description of the components of the apparatus 100.

During operation of the nozzle supply system 140, one or more of the first reservoir system 102 and the second reservoir system 103 contain the fluid target material 120. At least one of the first reservoir system 102 and the second reservoir system 103 can thereby deliver the fluid target material 120 to the nozzle supply system 140 during operation of the nozzle supply system 140. At the same time, the priming system 104 is configured to produce the fluid target material 120 from the solid matter 122 that includes the target material (and stores the fluid target material 120 within a priming tank 114). The priming system 104 supplies the second reservoir system 103 with the fluid target material 120 at various times and stages during operation of the nozzle supply system 140; specifically, when the second reservoir system 103 is fluidly isolated from the nozzle supply system 140 and the first reservoir system 102 and the second reservoir system 103 can be at a lower pressure and fluidly communicating with the priming tank 114 of the priming system 104. In some implementations in which the priming tank 114 is operating at the same pressure as the first fluid reservoir 112, the priming system 104 can additionally, or alternatively supply the first reservoir system 102 with the fluid target material 120.

Figure 3:
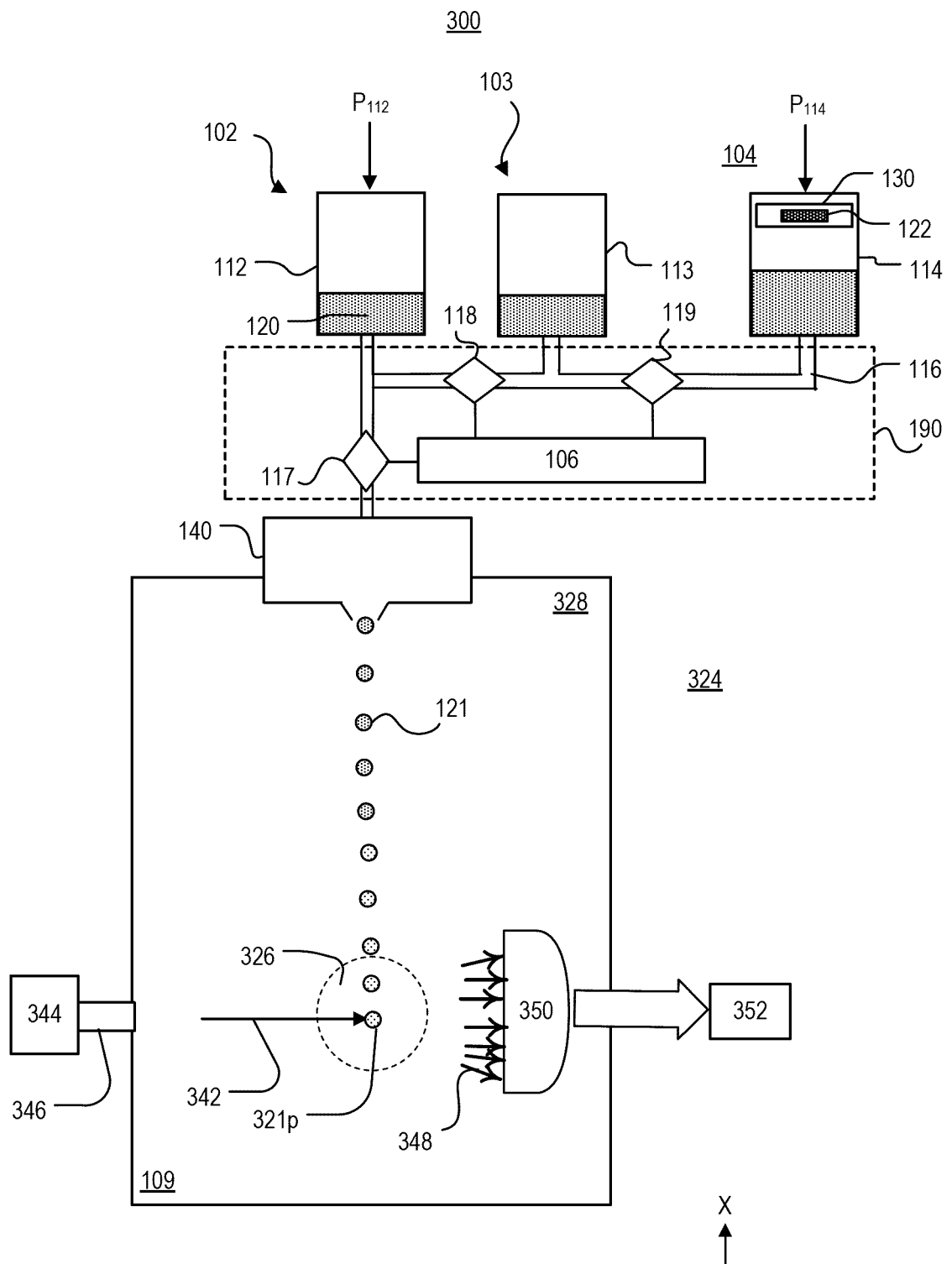
FIG. 3 is a block diagram of the apparatus of FIG. 1, in which the nozzle supply system emits a stream of targets of the fluid target material for use by an EUV light source.

The nozzle supply system 140 is configured to receive the fluid target material 120 from the apparatus 100 and to supply the fluid target material 120 in the form of the stream of targets 121 to the system 124. For example, as shown in FIG. 3, if the system 124 is an EUV light source 324, the nozzle supply system 140 can emit the stream of targets 121 made from the fluid target material 120 such that a target 321p is delivered to a plasma formation location 326 in a vacuum chamber 328. The plasma formation location 326 can receive at least one light beam 342 that has been generated by an optical source 344 and delivered to the vacuum chamber via an optical path 346. An interaction between the light beam 342 and the target material in the target 321p produces a plasma that emits EUV light 348, which is collected 350 and supplied to a lithography exposure apparatus 352. In this example, the fluid target material 120 can be any material that emits EUV light 348 when in a plasma state. For example, the fluid target material 120 can include water, tin, lithium, and/or xenon.

The first reservoir system 102 includes a first fluid reservoir 112 that is a vessel configured to contain the fluid target material 120 and be in continuous fluid communication with the nozzle supply system 140 during operation of the nozzle supply system 140. The first fluid reservoir 112 is a volume that is defined by a structure that can be formed, lined, or reinforced with molybdenum (Mo), forged Mo, or any material that remains stable and solid above the melting point of the fluid target material 120 and is also not chemically reactive with the fluid target material 120. The first fluid reservoir 112 is in fluid communication with the nozzle supply system 140 via the fluid communication apparatus 116 that is fluidly coupled and controlled by the fluid controller 106.

The first fluid reservoir 112 is maintained at a first pressure $P_{112}$, which, in some implementations, is adjustable by the environment control apparatus 236 during operation of the nozzle supply system 140. At some times during operation, the first pressure $P_{112}$ can be, for example, at least 6000 kilopascals, at least 10,000 kilopascals, at least 25,000 kilopascals, or within a range of 6,000 kilopascals and 60,000 kilopascals for other implementations. During operation of the nozzle supply system 140, and when the first fluid reservoir 112 is supplying the fluid target material 120 to the nozzle supply system 140, the first pressure $P_{112}$, for example, can be any suitable pressure that is greater than a pressure within the nozzle supply system 140.

The second reservoir system 103 includes a second fluid reservoir 113 that is a vessel configured to contain the fluid target material 120 and be in fluid communication with the first reservoir system 102 for at least part of the time during operation of the nozzle supply system 140. The second fluid reservoir 113 is a volume that is defined by a structure that can be formed, lined, or reinforced with molybdenum (Mo), forged Mo, or any material that remains stable and solid above the melting point of the fluid target material 120 and is also not chemically reactive with the fluid target material 120. The second fluid reservoir 113 is in fluid communication with the first reservoir system 102 via the fluid communication apparatus 116 and under control of the fluid controller 106.

In some implementations, the volume within the structure of the second fluid reservoir 113 is the same size as the volume within the structure of the first fluid reservoir 112; so that the first and second fluid reservoirs 112, 113 can hold/retain the same amount of fluid target material 120. In other implementations, the volume within the structure of the second fluid reservoir 113 can be greater than the volume within the structure of the first fluid reservoir 112. In these implementations, the second fluid reservoir 113 would be able to hold/retain a larger amount of fluid target material 120 than the first fluid reservoir 112.

The second fluid reservoir 113 is maintained at a second pressure $P_{113}$, which can be adjustable by the environment control apparatus 236 during operation of the nozzle supply system 140. The value of the second pressure $P_{113}$ at any one moment can depend on the current operation of the apparatus 100. For example, at some times, the second pressure $P_{113}$ of the second fluid reservoir 113 can be the same as a priming pressure $P_{114}$ at which the priming system 104 is maintained. As another example, at other times, the second pressure $P_{113}$ of the second fluid reservoir 113 can be the same as the first pressure $P_{112}$ at which the first fluid reservoir 112 is maintained. And, still at other times, the second pressure $P_{113}$ of the second fluid reservoir 113 can be atmospheric pressure when the second fluid reservoir 113 is in fluid communication with the priming system 104, which is also maintained at atmospheric pressure.

The priming system 104 includes a priming tank 114 that is a vessel configured to contain the fluid target material 120 (that is produced from the solid matter 122). The priming tank 114 is in fluid communication with one or more of the first reservoir system 102 and the second reservoir system 103 for at least part of the time during operation of the nozzle supply system 140. The priming system 104 is configured to produce the fluid target material 120 from the solid matter 122 and can fluidly communicate with one or more of the second reservoir system 103 to refill the second reservoir system 103 with the fluid target material 120 and the first reservoir system 102 to refill the first reservoir system 102 with fluid target material 120. The priming system 104 can also include a priming chamber 130 configured to receive the solid matter 122 that contains the target material. The priming chamber 130 can include, for example, a removable cover such that the solid matter 122 can be replaced inside the priming chamber 130.

The priming system 104 and the second fluid reservoir 103 can be positioned relative to each other such that the second fluid reservoir 103 is prevented from overfilling with the fluid target material 120 when the priming system 104 is refilling the second reservoir system 103.

At various times during operation of the nozzle supply system 140, the priming tank 114 is in fluid communication with one or more of the first reservoir system 102 and the second reservoir system 103 via the fluid communication apparatus 116 and such fluid communication is under control of the fluid controller 106 of the fluid control system 190. The priming chamber 130 is in fluid communication with the priming tank 114 to enable the fluid target material 120 produced from the solid matter 122 inside the priming chamber 130 to be supplied to the priming tank 114 in an environmentally-controlled manner.

The priming pressure $P_{114}$ is a pressure at which the priming tank 114 is maintained. The priming pressure $P_{114}$ is adjustable, depending on whether fluid target material 120 is being supplied to one or more of the first reservoir system 102 and the second reservoir system 103. For example, the priming pressure $P_{114}$ can be maintained at a low (such as atmospheric) pressure (which is about 101 kilopascals) when the priming tank 114 is being refilled with the solid matter 122 from the priming chamber 130.

As described above, the fluid control system 190 is configured to control the fluid communication between the first reservoir system 102, the second reservoir system 103, and the priming system 104 to maintain continuous supply of the fluid target material 120 to the nozzle supply system 140. Specifically, the fluid controller 106 is configured to determine the current fluid state of one or more regulation devices 117, 118, 119; to receive input regarding a desired fluid communication within the apparatus 100; and to adjust the fluid state of one or more of the regulation devices 117, 118, 119 based on the desired fluid communication within the apparatus 100.

The fluid controller 106 can include or have access to one or more programmable processors and can each execute a program of instructions to perform desired functions by operating on input data and generating appropriate output to the one or more regulation devices 117, 118, 119. The fluid controller 106 can be implemented in any of digital electronic circuitry, computer hardware, firmware, or software. In further implementations, the fluid controller 106 can access memory, and the memory can be read-only memory and/or random-access memory and can provide a storage device suitable for tangibly embodying computer program instructions and data. The fluid controller 106 can also include one or more input devices (such as a keyboard, touch-enabled devices, audio input devices) and one or more output devices such as audio output or video output. The fluid controller 106 can communicate with one or more actuation elements within each of the regulation devices 117, 118, 119.

During operation of the nozzle supply system 140, the fluid controller 106 can be instructed to isolate the first fluid reservoir 112 and the nozzle supply system 140 from the second fluid reservoir 113 and the priming tank 114 (during replenishment of the fluid target material 120 in the second fluid reservoir 113). Such isolation can be implemented, at least in part, by the fluid controller 106 instructing the regulation device 118 to close, which causes the regulation device 118 to close and block fluid target material 120 from passing. At other times (for example, when both the first reservoir system 102 and the second reservoir system 103 have enough fluid target material 120), the fluid controller 106 is instructed to isolate the first fluid reservoir 112, the second fluid reservoir 113, and the nozzle supply system 140 from the priming tank 114 during operation of the nozzle supply system 140. Such isolation can be implemented, at least in part, by the fluid controller 106 instructing the regulation device 119 to close, thus causing the regulation device 119 to close and block fluid target material 120 from passing.

Further, the fluid controller 106 can be instructed to maintain a continuous fluid flow path between the first fluid reservoir 112 and the nozzle supply system 140 during operation of the nozzle supply system 140. This continuous fluid flow path can be implemented, at least in part, by the fluid controller 106 sending an instruction to the regulation device 117 of the fluid communication apparatus 116 to open or to remain open. The fluid controller 106 can be instructed to maintain a fluid flow path between the first fluid reservoir 112, the second fluid reservoir 113, and the nozzle supply system 140 at least part of the time during operation of the nozzle supply system 140. This continuous fluid flow path can be implemented, at least in part, by the fluid controller 106 sending an instruction to the regulation devices 117 and 118 of the fluid communication apparatus 116 to open or to remain open.

With reference to FIG. 2, an implementation 216 of the fluid communication apparatus 116 and an implementation 200 of the apparatus 100 are shown. In the fluid communication apparatus 216, the regulation device 118 (of FIG. 1) corresponds to a reservoir valve system 218 and the regulation device 119 (of FIG. 1) corresponds to a refill valve system 219. The reservoir valve system 218 and the refill valve system 219 are controlled by the fluid controller 106. The reservoir valve system 218 is located between the first fluid reservoir 112 and the second fluid reservoir 113, and is configured to fluidly isolate the first fluid reservoir 112 and the nozzle supply system 140 from the second fluid reservoir 113 and the priming tank 114 for at least part of the time during operation of the nozzle supply system 140. The refill valve system 219 is located between the second fluid reservoir 113 and the priming tank 114, configured to fluidly isolate the first fluid reservoir 112, the nozzle supply system 140, and the second fluid reservoir 113 from the priming tank 114 for at least part of the time during operation of the nozzle supply system 140.

In some implementations, the reservoir valve system 218 and the refill valve system 219 include, respectively, a reservoir freeze valve 218F and a refill freeze valve 219F. The reservoir freeze valve 218F and the refill freeze valve 219F are controlled by the fluid controller 106. A freeze valve includes a tube section (that contains the fluid target material 120 and permits it to pass on either side of the freeze valve) and a regulation temperature adjusting device that is in thermal communication with the tube section. The regulation temperature adjusting device is configured to change a temperature of the tube section across a range of temperatures about a melting point of the fluid target material 120. For example, the regulation temperature adjusting device can be a cartridge heater in thermal communication with the tube section. If the temperature of the tube section is kept substantially below the melting point of the fluid target material 120, then any liquid that is inside the tube section would solidify (change state to a frozen state), and this solid matter plugs the flow channel through that tube section, thereby preventing further fluid target material 120 from passing through the freeze valve. The solid matter can be melted when the regulation temperature adjusting device heats the tube section to a temperature above the melting point of the solid matter and if the temperature is high enough, that is suitably exceeds the melting point of the solid matter, then the solid matter in the plug melts to form the fluid target material 120, which can now freely flow through the flow channel of the tube section.

For example, the reservoir freeze valve 218F fluidly isolates the first fluid reservoir 112 and the nozzle supply system 140 from the second fluid reservoir 113 and the priming system 104 when the temperature adjusting device of the reservoir freeze valve 218F cools the tube section of the reservoir freeze valve 218F to a temperature suitably below the melting point of the fluid target material 120. Further, the refill freeze valve 219F fluidly isolates the priming system 104 from the nozzle supply system 140, the first fluid reservoir 112, and the second fluid reservoir 113 when the temperature adjusting device within the refill freeze valve 219F cools the tube section of the refill freeze valve 219F to a temperature suitably below the melting point of the fluid target material 120.

In some implementations, as shown in FIG. 2, the nozzle supply system 240 includes a capillary tube 241 extending generally along a longitudinal direction (that is parallel with the X direction) and defining an opening 243. The opening 243 is at an end of the capillary tube 241 and the opening 243 opens at one end to the system 124. The capillary tube 241 can be made from, for example, glass in the form of fused silica, borosilicate, aluminosilicate, or quartz. The fluid target material 120 flows through the capillary tube 241 and is ejected through the opening 243. The Laplace pressure is the difference in pressure between the inside and the outside of a curved surface that forms the boundary between a gas region and a liquid region. The pressure difference is caused by the surface tension of the interface between the liquid and the gas. When the first pressure $P_{112}$ of the first fluid reservoir 112 is greater than the Laplace pressure, the fluid target material 120 exits the opening 243 as the stream of targets 121.

The nozzle supply system 140 is configured to supply the fluid target material 120 to the system 124. The pressure $P_{124}$ of the system 124 that is external to the nozzle supply system 140 can be at or below the pressure $P_{112}$ applied to the first reservoir system 102 such that the fluid target material 120 is forced out of the nozzle supply system 140 due to a pressure differential between the pressure $P_{112}$ (which is applied to the nozzle supply system 140) and the pressure $P_{124}$ of the system 124. In some implementations, the first pressure $P_{112}$ of the first fluid reservoir 112 is greater than atmospheric pressure and the pressure $P_{124}$ of the system 124 is less than atmospheric pressure.

As mentioned above, the environment control apparatus 236 is configured to independently control the temperatures and the pressures of each of the first fluid reservoir 112 and the second fluid reservoir 113. The environment control apparatus 236 is configured to independently and separately control the first pressure $P_{112}$ of the first fluid reservoir 112 and the second pressure $P_{113}$ of the second fluid reservoir 113. The environment control apparatus 236 is also configured to independently and separately control a first temperature $T_{112}$ of the first fluid reservoir 112 and a second temperature $T_{113}$ of the second fluid reservoir 113. As shown in FIG. 2, the environment control apparatus 236 can be configured to independently control a temperature and a pressure of one or more aspects of the nozzle supply system 240. And, the fluid controller 106 can control one or more aspects of fluid flow within the nozzle supply system 240. These controls are discussed in greater detail with reference to the nozzle supply system 540 of FIG. 5.

The environment control apparatus 236 can include a plurality of components each configured to independently and separately control either the temperature or the pressure of either of the first fluid reservoir 112 and the second fluid reservoir 113. For example, the environment control apparatus 236 can include a component to control the first pressure $P_{112}$ of the first fluid reservoir 112, a component to control the second pressure $P_{113}$ of the second fluid reservoir 113, a component to control the first temperature $T_{112}$ of the first fluid reservoir 112, and a component to control the second temperature $T_{113}$ of the second fluid reservoir 113. Each of the components that independently and separately control the first pressure $P_{112}$ of the first fluid reservoir 112 and the second pressure $P_{113}$ of the second fluid reservoir 113 can be a pressure control component that is in fluid communication with the first fluid reservoir 112 or the second fluid reservoir 113, respectively. In some implementations, a pressuring gas can be applied to each of the cavities of the first fluid reservoir 112 and the second fluid reservoir 113, and by adjusting the pressure of the respective pressuring gas, the respective first pressure $P_{112}$ and second pressure $P_{113}$ can be adjusted. A pressuring gas that is inert or non-reactive with the fluid target material 120 should be used. For example, the pressuring gas can be a mixture of hydrogen and argon, such as a mixture of 2% hydrogen in argon. Additionally, the environment control apparatus 236 can include a controller that analyzes the data from various sensors/measurement devices within the apparatus 200 and determines how to adjust the components within the apparatus 200 based on such analysis.

In another example, each of the components that independently and separately control the first temperature $T_{112}$ of the first fluid reservoir 112, and the second temperature $T_{113}$ of the second fluid reservoir 113 can include an oven, a thermo-couple device, or another device configured to measure and maintain each of the first temperature $T_{112}$ and the second temperature $T_{113}$. For example, the environment control apparatus 236 can include pressure transducers on each of the first fluid reservoir 112, the second fluid reservoir 113 and the priming tank 114. The environment control apparatus 236 can include one or more thermo-couple devices for each zone or region within the apparatus 200 where a temperature needs to be monitored.

Referring again to FIG. 1, in some implementations, the solid matter 122 is an ingot (such as a block or disk) made mostly of tin. The ingot can be at least 99% (or at least 99.9%) by weight pure. This means that there could be trace amounts of other non-tin material (such as lead and antimony) that could be present in the solid matter 122. In this example, in which the solid matter 122 is a tin ingot, the priming system 104 includes a device or devices that heat the solid matter 122 to a temperature above 450° F. (which is the melting point of tin). When melted, the solid tin turns into liquid tin and other non-tin material (such as the lead and antimony, or molecules or other components). The non-tin material can include one or more molecules, atoms, compounds, or other components, each of which is in the solid or liquid state, depending on the melting point of that component. The liquid tin (in this case, becomes the fluid target material 120) is therefore supplied to the priming tank 114. For example, a 5 kilogram tin ingot can be placed into the priming chamber 130 in the priming system 104 every 400 hours during operation of the nozzle supply system 140. In other examples, other ingot sizes may be placed into the priming chamber 130 at other replacement frequencies.

Figure 4:
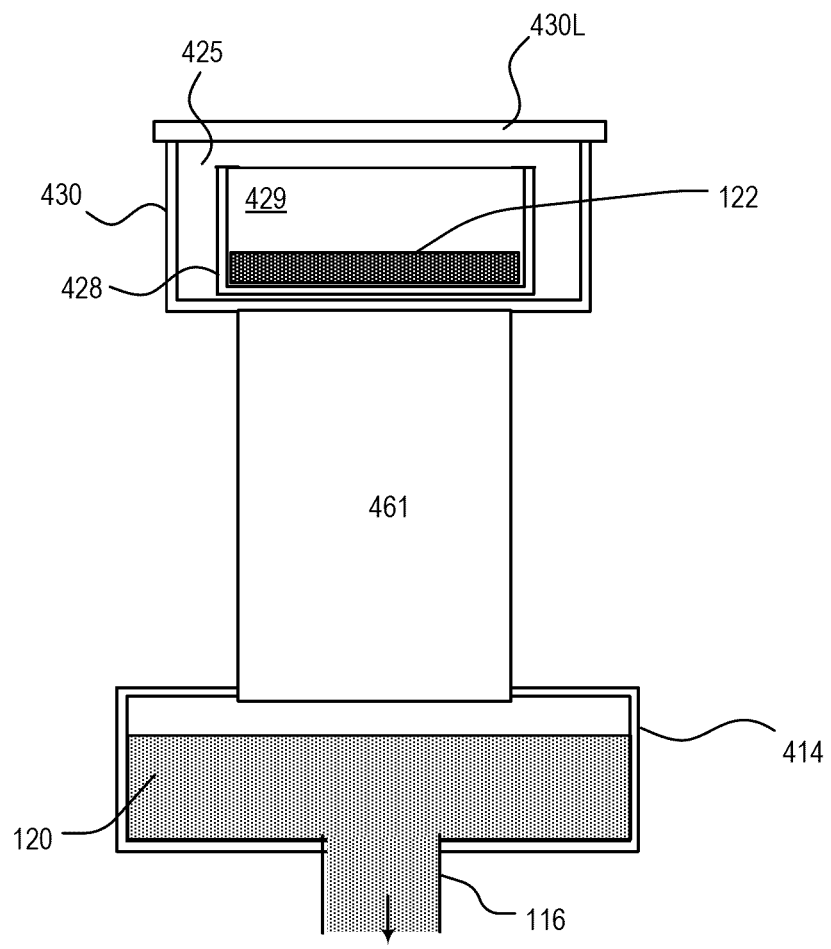
FIG. 4 is a block diagram of an implementation of a priming system that can be used in the apparatus of FIG. 1.

Referring to FIG. 4, an implementation of the priming system 104 (as shown in FIG. 1) is shown as a priming system 404. The priming system 404 includes a priming tank 414 (that acts to store the fluid target material 120 and supply the fluid target material 120 to the first reservoir system 102 and/or the second reservoir system 130), a priming chamber 430 (that is used to reload the solid matter 122), and a fluid transport system 461. The priming chamber 430 includes a primary cavity 425 which is large enough to receive a removable carrier 428. The solid matter 122 is received within a secondary cavity 429 of the removable carrier 428. The priming chamber 430 includes a removable lid 430L that serves as a mechanism to hermetically seal the primary cavity 425 and also to enable the removal of the removable carrier 428 when the solid matter 122 needs to be replaced. The priming chamber 430 can include, for example, a tube section having a central fluid flow channel that is a part of a fluid flow path between the priming chamber 430 and the fluid transport system 461. The tube section can extend from the priming chamber 430 and the removable carrier 428, an interior of the tube section can be in fluid communication with a transport opening defined by the secondary cavity 429 and also can be in fluid communication with the fluid transport system 461 via a flow channel.

For example, the fluid transport system 461 can include a regulation apparatus that controls a flow of fluid from the priming chamber. In this way, the regulation apparatus can control the fluid flow path between the priming chamber 430 and the priming tank 414. The regulation apparatus can include, for example, a valve arrangement including one or more valves that interacts with the central fluid flow channel of the tube section so that a flow of the fluid target material 120 within the central fluid flow channel is controlled by the operation of the one or more valves of the valve arrangement.

In some implementations, the valve arrangement of the fluid transport system 461 can include a freeze valve. A freeze valve can include a tube section and a regulation temperature adjusting device that is in thermal communication with the tube section. The regulation temperature adjusting device is configured to change a temperature of the tube section across a range of temperatures about a melting point of the solid matter 122. The regulation temperature adjusting device can be a cartridge heater in thermal communication with the tube section. For example, if the temperature of the tube section is kept substantially below the melting point of the solid matter 122, then any liquid that has flowed out of the carrier 428 (due to the force of gravity) would solidify as it reaches the central fluid flow channel and this solid matter plugs the central fluid flow channel to prevent further fluid from flowing through the central fluid flow channel. The solid matter 122 can therefore be melted when the regulation temperature adjusting device heats the tube section to a temperature above the melting point of the solid matter 122, and if the temperature is high enough (that is, exceeds this melting point), the solid matter 122 in the plug melts and freely flows through the central fluid flow channel.

In certain implementations, the valve arrangement of the fluid transport system 461 can include a gate valve in addition to the freeze valve, and the gate valve can be placed between the freeze valve and the priming tank 414. The gate valve can be opened prior to heating the tube section of the freeze valve so that melted fluid does not come in contact with the actual gate of the gate valve.

Any components of the apparatus 100 (including the first reservoir system 102, the second reservoir system 103, the priming system 104, and the fluid communication apparatus 116) that come in contact with any fluid flow path or fluid cavity should be made of a material that is compatible with and non-reactive (at the relevant temperatures) to the solid matter 122, the fluid target material 120, and any non-target material that can be present in the solid matter 122 (and whether in solid or fluid or liquid form). For example, the structure of the first fluid reservoir 112; the structure of the second fluid reservoir 113; the priming chamber 430, the removable carrier 428, the regulation apparatus, or other components in the fluid transport system 461; the regulation devices 117, 118, 119 and fluid transmission lines of the fluid communication apparatus 116 can be made of various rigid metals or metal alloys.

Figure 5:
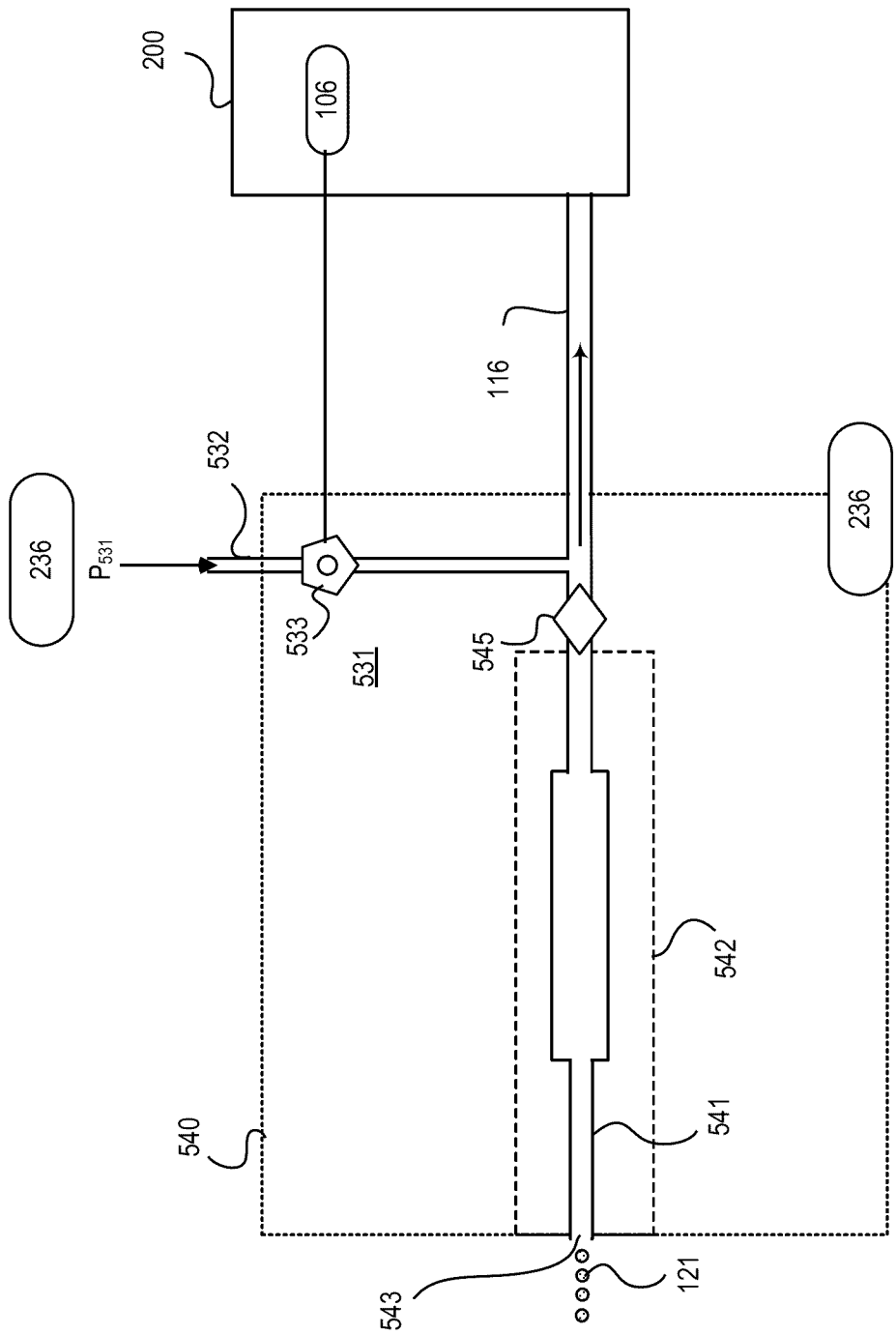
FIG. 5 is a block diagram of an implementation of a nozzle supply system that can be used in the apparatus of FIG. 1.

In addition, and with reference to FIG. 5, in some implementations, a nozzle supply system 540 includes dedicated components 531 configured to operate, under control of the environment control apparatus 236 and the fluid controller 106 to clear fluid target from interfaces within the nozzle supply system 540 and also within the apparatus 100.

In this implementation, the nozzle supply system 540 includes a nozzle assembly 542 having a capillary tube 541 extending generally along its longitudinal direction and defining an opening 543 through which the fluid target material 120 exits as the stream of targets 121. The dedicated components 531 include a gas line 532 that is fluidly coupled at one end to the fluid communication apparatus 116 between the regulation device 117 of the apparatus 200 and the nozzle assembly 542. The gas line 532 is fluidly coupled to a gas source at another end. The dedicated components 531 also include a fluid valve 533 such as a service freeze valve for opening and closing a fluid flow path of the gas line 532, the fluid flow path being defined between the gas source at one end and the nozzle assembly 542 and the apparatus 200 at another end.

The environment control apparatus 236 includes a temperature adjustment device in thermal communication with the fluid communication apparatus 116 and the gas line 532 along the path between the regulation device 117 and the nozzle assembly 542 and a pressure adjustment device that can pressurize the gas line 532. At certain moments, such as when the nozzle assembly 542 needs to be replaced, and prior to replacing the nozzle assembly 542, the fluid controller 106 instructs the fluid valve 533 to open, for example, if the fluid valve 533 is a freeze valve, then it can be warmed or heated to a temperature above the melting point of the fluid target material 120. The environment control apparatus 236 can increase a pressure $P_{531}$ applied to the gas line 532 to a pressure greater than the first pressure $P_{112}$ applied to the first fluid reservoir 112 to thereby push the fluid target material 120 remaining within the nozzle assembly 542 and/or in the flow path between the nozzle assembly 542 and the first fluid reservoir 112 back toward the first fluid reservoir 112.

The nozzle supply system 540 can further include a nozzle valve system 545 located between the capillary tube 541 and the gas line 532. The nozzle valve system 545 can be configured to fluidly isolate the nozzle assembly 542 from the apparatus 200 after the fluid target material 120 has been cleared from the fluid communication apparatus 116.

Figure 6:
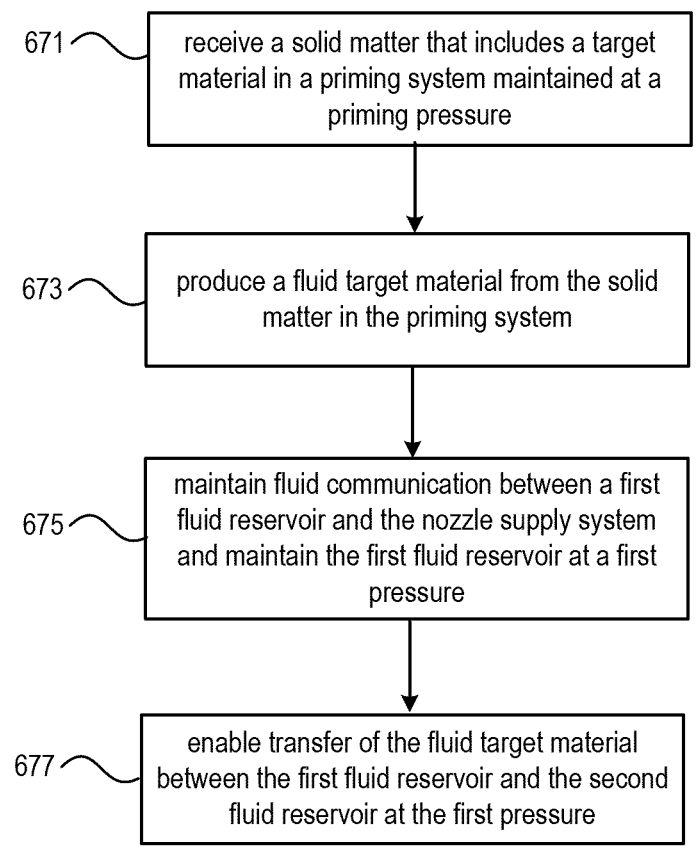
FIG. 6 is a flow chart of a procedure performed by the apparatus of FIG. 1.
Figure 8A:
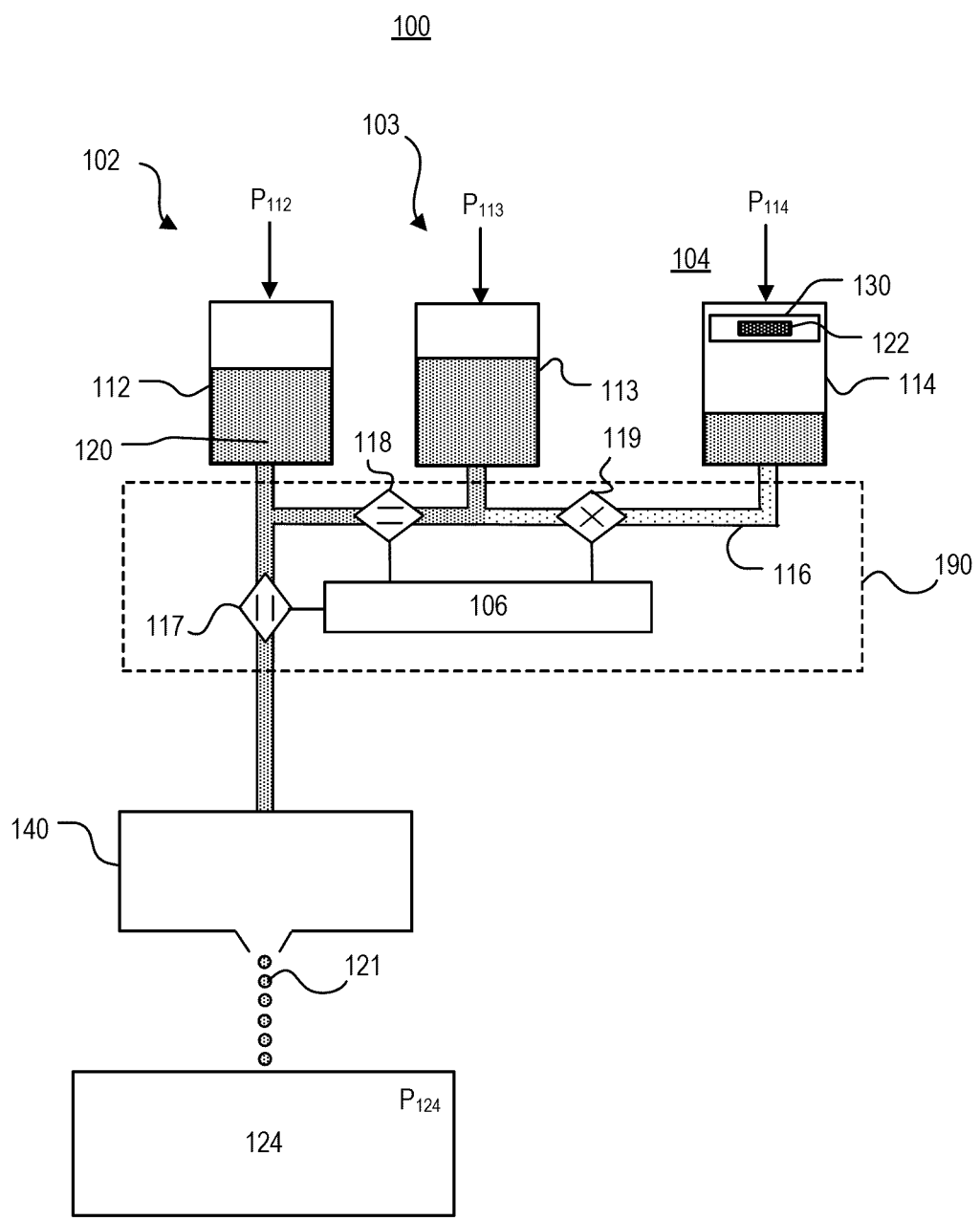
FIG. 8A is a block diagram showing a moment during a normal mode of operation of the apparatus of FIG. 1.

Referring to FIG. 6, a procedure 670 is performed by the apparatus 100 for controlling a transfer of the fluid target material 120 to the nozzle supply system 140 (as shown in FIG. 1) while the nozzle supply system 140 is operating to produce the fluid target material 120 to the system 124. Additional reference is made to FIG. 8A when discussing the steps of the procedure 670. FIG. 8A depicts the relevant components of an implementation of the apparatus 100 through the various steps in the procedure 670.

Initially, as shown in FIG. 8A, the priming system 104 receives the solid matter 122 that includes the target material [671]. The priming system 104 is maintained at a priming pressure $P_{114}$. For example, with reference to FIG. 4, the lid 430L on the priming chamber 430 can be opened or removed from the body of the priming chamber 430 to enable the solid matter 122 to be received within the priming chamber 430 (or, the removable carrier 428). During this time, the priming chamber 130 is therefore exposed to atmospheric pressure. The solid matter 122 can have a size and weight based on the size of the priming chamber 430. Moreover, this process of opening the lid 430L and inserting the solid matter 122 into the priming chamber 430 can be automated, without requiring human intervention.

Additionally, the priming chamber 430 (or the removable carrier 428) can be equipped with a sensor system that can detect when the lid 430L is closed or when the solid matter 122 is present within the priming chamber 430.

During this time (in which the priming system 104 receives the solid matter 122 [671]), because the priming pressure $P_{114}$ is at atmospheric pressure, the priming system 104 can be fluidly isolated from the rest of the apparatus 100. For example, prior to opening the priming system 104 to receive the solid matter 122, the fluid controller 106 can instruct the regulation device 119 to close to thereby fluidly isolate the priming system 104 from the second fluid reservoir 113, the first fluid reservoir 112, and the nozzle supply system 140. In this way, during this time, the fluid target material 120 is prevented from transferring via the fluid communication connection 116 from the primary tank 114 to any of the second fluid reservoir 113, the first fluid reservoir 112, and the nozzle supply system 140.

The priming system 104 produces the fluid target material 120 from the solid matter 122 [673]. An example of how the priming system 104 produces the fluid target material 120 from the solid matter 122 is provided next with reference to FIG. 4. Initially, the primary cavity 425 of the priming chamber 430 can be sealed by, for example, securing the lid 430L to the rest of the priming chamber 430. The cavity of the priming tank 414 and the primary cavity 425 can be in fluid communication with each other to enable the pressures to equalize and also to enable the eventual target material fluid 120 to be able to freely flow from the priming chamber 430 to the priming tank 414. At this time, the primary cavity 425, at least a portion of the transport system 461, and a cavity of the priming tank 414 can be maintained at a priming pressure $P_{114}$ that is below atmospheric pressure. Next, the inserted solid matter 122 is heated to a temperature above the melting point of the solid matter 122, until the solid matter 122 turns into the fluid target material 120.

During this time that the fluid target material 120 is being produced from the solid matter 122 within the priming system 104 [673], the regulation device 119 continues to isolate the priming system 104 from the second fluid reservoir 113, the first fluid reservoir 112, and the nozzle supply system 140. In this way, the operation of the nozzle supply system 140 to supply fluid target material 120 to the system 124 can be maintained.

Additionally, during this time that the nozzle supply system 140 is supplying fluid target material 120 to the system 124, the fluid control system 190 maintains fluid communication between the first fluid reservoir 112 and the nozzle supply system 140 [675]. For example, the fluid controller 106 can instruct the regulation device 117 to remain open during this time to enable the transfer of the fluid target material 120 from the first fluid reservoir 112 to the nozzle supply system 140 via the fluid communication connection 116. Moreover, the environment control apparatus 236 (FIG. 2) maintains the first fluid reservoir 112 at the first pressure $P_{112}$, and the first pressure $P_{112}$ is greater than the priming pressure $P_{114}$. The environment control apparatus 236 (FIG. 2) can also ensure that the first pressure $P_{112}$ of the first fluid reservoir 112 is greater than the pressure $P_{124}$ to enable the efficient continuous transfer of fluid target material 120 from the first fluid reservoir 112 to the nozzle supply system 140 during operation of the nozzle supply system 140.

While the fluid target material 120 is being produced in the priming system 104 at the priming pressure $P_{114}$, with reference to FIG. 8A, the fluid control system 190 enables the fluid target material 120 to transfer between the first fluid reservoir 112 and the second fluid reservoir 113 for at least part of the time during operation of the nozzle supply system 140 [677]. For example, the fluid controller 106 can instruct the regulation device 118 to open to enable the transfer of the fluid target material 120 between the first fluid reservoir 112 and the second fluid reservoir 113 by way of the fluid communication connection 116.

Figure 7:
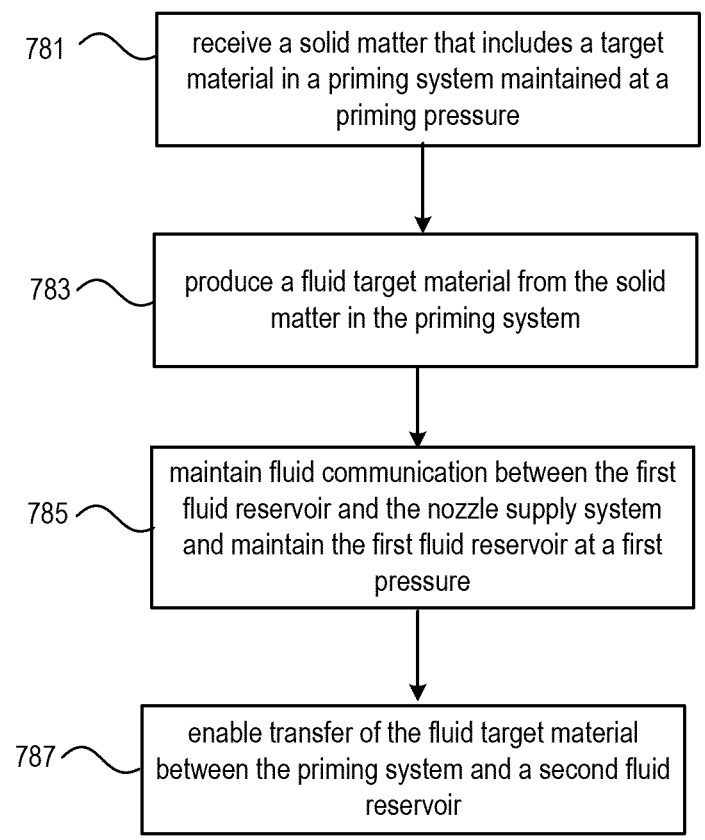
FIG. 7 is a flow chart of another procedure performed by the apparatus of FIG. 1.
Figure 8B:
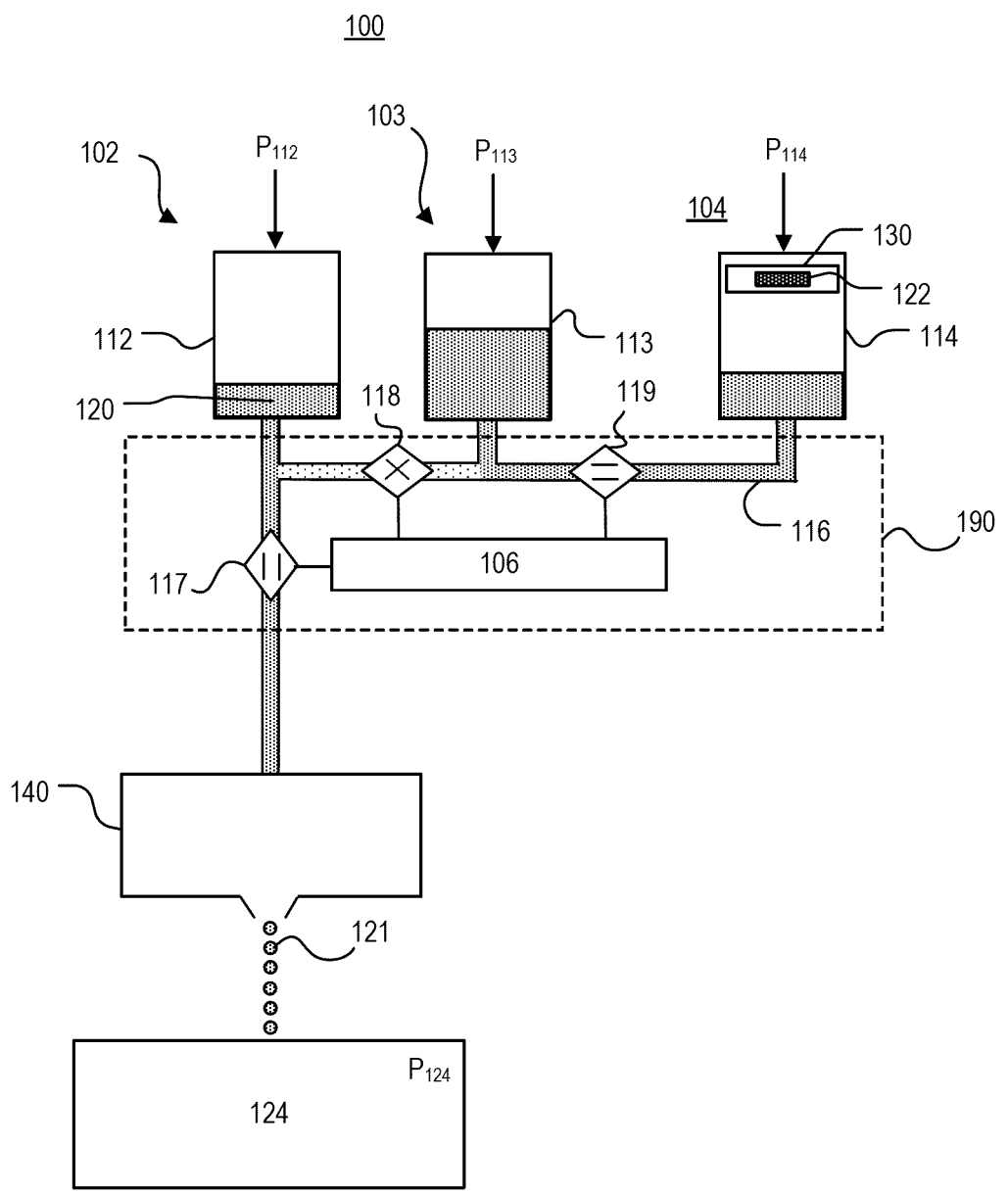
FIG. 8B is a block diagram showing a moment during a replenish mode of operation of the apparatus of FIG. 1.

Referring to FIG. 7, a procedure 780 is performed by the apparatus 100 for controlling a transfer of the fluid target material 120 to the nozzle supply system 140 (as shown in FIG. 1) while the nozzle supply system 140 is operating to produce the fluid target material 120 to the system 124. Additional reference is made to FIG. 8B when discussing the steps of the procedure 780. FIG. 8B depicts the relevant components of an implementation of the apparatus 100 through the various steps in the procedure 780.

Initially, as shown in FIG. 8B, and as described above, the priming system 104 receives the solid matter 122 that includes the target material [781]. The priming system 104 is maintained at the priming pressure $P_{114}$. For example, with reference to FIG. 4 and as described above, the solid matter 122 can be received within the priming chamber 430. During this time, the priming chamber 130 is therefore exposed to atmospheric pressure and the priming system 104 can be fluidly isolated from the rest of the apparatus 100. For example, prior to opening the priming system 104 to receive the solid matter 122, the fluid controller 106 can instruct the regulation device 119 to close to thereby fluidly isolate the priming system 104 from the second fluid reservoir 113, the first fluid reservoir 112, and the nozzle supply system 140. In this way, during this time, the fluid target material 120 is prevented from transferring via the fluid communication connection 116 from the primary tank 114 to any of the second fluid reservoir 113, the first fluid reservoir 112, and the nozzle supply system 140.

The priming system 104 produces the fluid target material 120 from the solid matter 122 [783]. For example, and as described above, the inserted solid matter 122 is heated to a temperature above the melting point of the solid matter 122, until the solid matter 122 turns into the fluid target material 120. During this time, the regulation device 119 continues to isolate the priming system 104 from the second fluid reservoir 113, the first fluid reservoir 112, and the nozzle supply system 140.

In this way, the operation of the nozzle supply system 140 to supply the fluid target material 120 to the system 124 can be maintained.

Additionally, during this time that the nozzle supply system 140 is supplying fluid target material 120 to the system 124, the fluid control system 190 maintains fluid communication between the first fluid reservoir 112 and the nozzle supply system 140 [785]. For example, and as described above, the fluid controller 106 can instruct the regulation device 117 to remain open during this time to enable the transfer of the fluid target material 120 from the first fluid reservoir 112 to the nozzle supply system 140 via the fluid communication connection 116. Moreover, the environment control apparatus 236 (FIG. 2) maintains the first fluid reservoir 112 at the first pressure $P_{112}$, the first pressure $P_{112}$ greater than the priming pressure $P_{114}$. The environment control apparatus 236 (FIG. 2) can also ensure that the first pressure $P_{112}$ of the first fluid reservoir 112 is greater than the pressure $P_{124}$ to enable the efficient continuous transfer of fluid target material 120 from the first fluid reservoir 112 to the nozzle supply system 140 during operation of the nozzle supply system 140.

When the first fluid reservoir 112 and the nozzle supply system 140 are fluidly isolated from the priming system, with reference to FIG. 8B, the fluid control system 190 enables the fluid target material 120 to transfer between the priming system 104 and the second fluid reservoir 113 for at least part of the time during operation of the nozzle supply system 140 [787]. For example, the fluid controller 106 can instruct the regulation device 119 to open or to remain open (if already open) to enable the transfer of the fluid target material 120 between the priming system 104 and the second fluid reservoir 113 via the fluid communication connection 116. Additionally, during this time, the fluid controller 106 can instruct the regulation device 118 to close or to remain closed (if already closed) to thereby isolate the second fluid reservoir 113 and the priming system 104 from the first fluid reservoir 112 and the nozzle supply system 140. In this way, the operation of the nozzle supply system 140 to supply the fluid target material 120 to the system 124 can be maintained.

Either or both of the procedures 670 and 780 can also ensure that the first pressure $P_{112}$ of the first fluid reservoir 112 is maintained at a level that is greater than the second pressure $P_{113}$ and the priming pressure $P_{114}$ while fluid target material 120 is enabled to transfer between the priming system 104 and the second fluid reservoir 113, such as in FIG. 8B.

In some implementations, the transfer of fluid target material 120 to the nozzle supply system 140 throughout operation of the nozzle supply system 140 can be enabled by flowing the fluid target material 120 from the first fluid reservoir 112 to the nozzle supply system 140, from the second fluid reservoir 113 to the nozzle supply system 140, or from both the first fluid reservoir 112 and the second fluid reservoir 113 to the nozzle supply system 140.

Moreover, the environment control apparatus 236 can, during either or both of the procedures 670, 780, control the temperature and the pressure of the fluid target material 120 in each of the first fluid reservoir 112, the second fluid reservoir 113, and the priming system 104 in an independent and separate manner.

During a normal mode of operation of the apparatus 100, each of the first fluid reservoir 112 and the second fluid reservoir 113 have enough fluid target material 120 to supply the fluid target material 120 to the nozzle supply system 140 without disrupting the operation of the nozzle supply system 140 to provide the stream of targets 121 to the system 124. In normal operation, as shown in FIG. 8A, the first pressure $P_{112}$ (applied to the first fluid reservoir 112) and the second pressure $P_{113}$ (applied to the second fluid reservoir 113) are maintained at a high value. For example, the first pressure $P_{112}$ and the second pressure $P_{113}$ can each be maintained at or above 6000 kilopascals (kPa), at least 10,000 kPa, at least 25,000 kPa, or in a range of 6000-60,000 kPa. The first pressure $P_{112}$ and the second pressure $P_{113}$ can be maintained at a value that is greater than the pressure $P_{124}$ of the system, to enable the fluid target material 120 to be pushed through the nozzle supply system 140 and to the system 124. In this case, both of the first and second fluid reservoirs 112, 113 can supply the fluid target material 120 to the nozzle supply system 140. Additionally, during the normal mode of operation, the temperatures $T_{112}$ and $T_{113}$ applied to the first fluid reservoir 112 and the second fluid reservoir 113, respectively, can be maintained at a level above the melting point of the fluid target material 120 to ensure that the fluid target material 120 is maintained in a fluid state.

During the normal mode of operation, as shown in FIG. 8A, the regulation device 119 is closed to isolate the first fluid reservoir 112, the second fluid reservoir 113, and the nozzle supply system 114 from the priming system 104. Because the priming system 104 is fully isolated from the other parts of the apparatus 100, it is possible to prime (that is, prepare) fluid target material 120 in the priming system 104 during the normal mode of operation without impacting the normal mode of operation. In particular, the priming of the fluid target material 120 in the priming system 104 requires that the priming system 104 be operated at a different pressure and temperature from the other components (such as the first reservoir system 102 and the second reservoir system 103) of the apparatus 100. Because the priming system 104 is fluidly isolated and environmentally isolated during the normal mode of operation from the rest of the apparatus 100, this process of priming the fluid target material 120 in the priming system 104 can operate in parallel with the normal mode of operation.

The fluid target material 120 can be prepared in the priming system 104 as described next, and with reference to FIG. 4. In particular, solid matter 122 is inserted into the priming chamber 430. While the solid matter 122 is being inserted into the priming chamber 430, the temperature of the priming system 104 can be maintained at room temperature. Moreover, if a removable carrier 428 is used, the solid matter 122 can first be inserted into the removable carrier 428 and then the removable carrier 428 can be inserted into the priming chamber 430, and the lid 430L can then seal the priming chamber 430. Once the solid matter 122 is in the priming chamber 430, the temperature of the priming chamber 430 is increased until the solid matter 122 is melted into the fluid target material 120, at which time, the fluid transport system 461 controls the flow of fluid target material 120 into the priming tank 414, the priming tank 414 maintained at a temperature above the melting point of the fluid target material 120. Thus, fluid target material 120 can be stored within the priming tank 414 for later use by the apparatus 100.

Figure 9A:
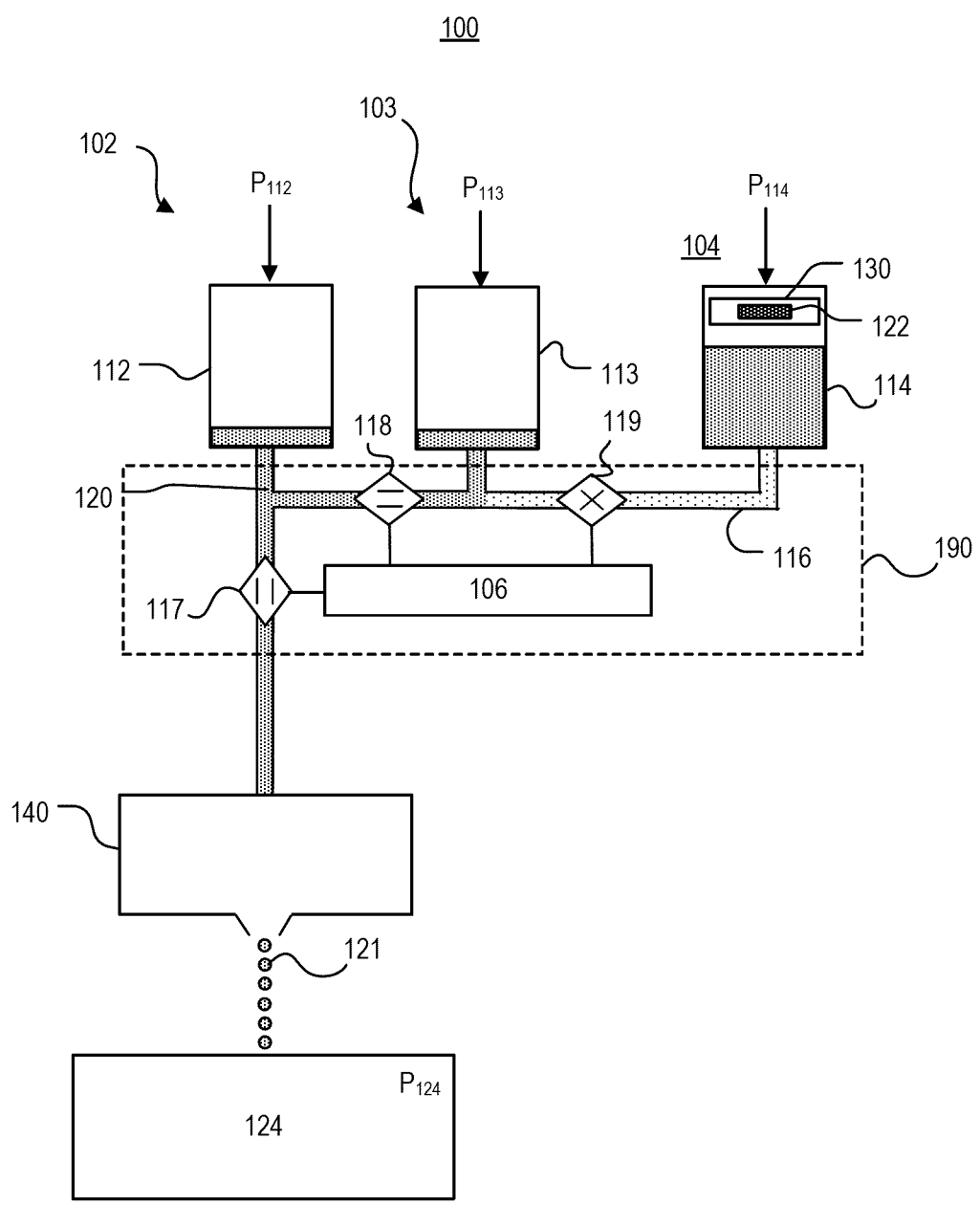
FIG. 9A is a block diagram showing a moment during the normal mode of operation of the apparatus of FIG. 1, in which the fluid target material has already been replenished in the priming system.

During normal operation, the amount of fluid target material 120 is gradually depleted from either or both of the first fluid reservoir 112 and the second fluid reservoir 113 as the fluid target material 120 is being used by the nozzle supply system 140 to produce the stream of targets 121, as shown in FIG. 8A. At some point during normal operation, as shown in FIG. 9A, the amount of fluid target material 120 becomes so low in the first fluid reservoir 112 and the second fluid reservoir 113 that it becomes necessary to switch from the normal mode of operation of the apparatus 100 to a replenish mode of operation of the apparatus 100.

Figure 9B:
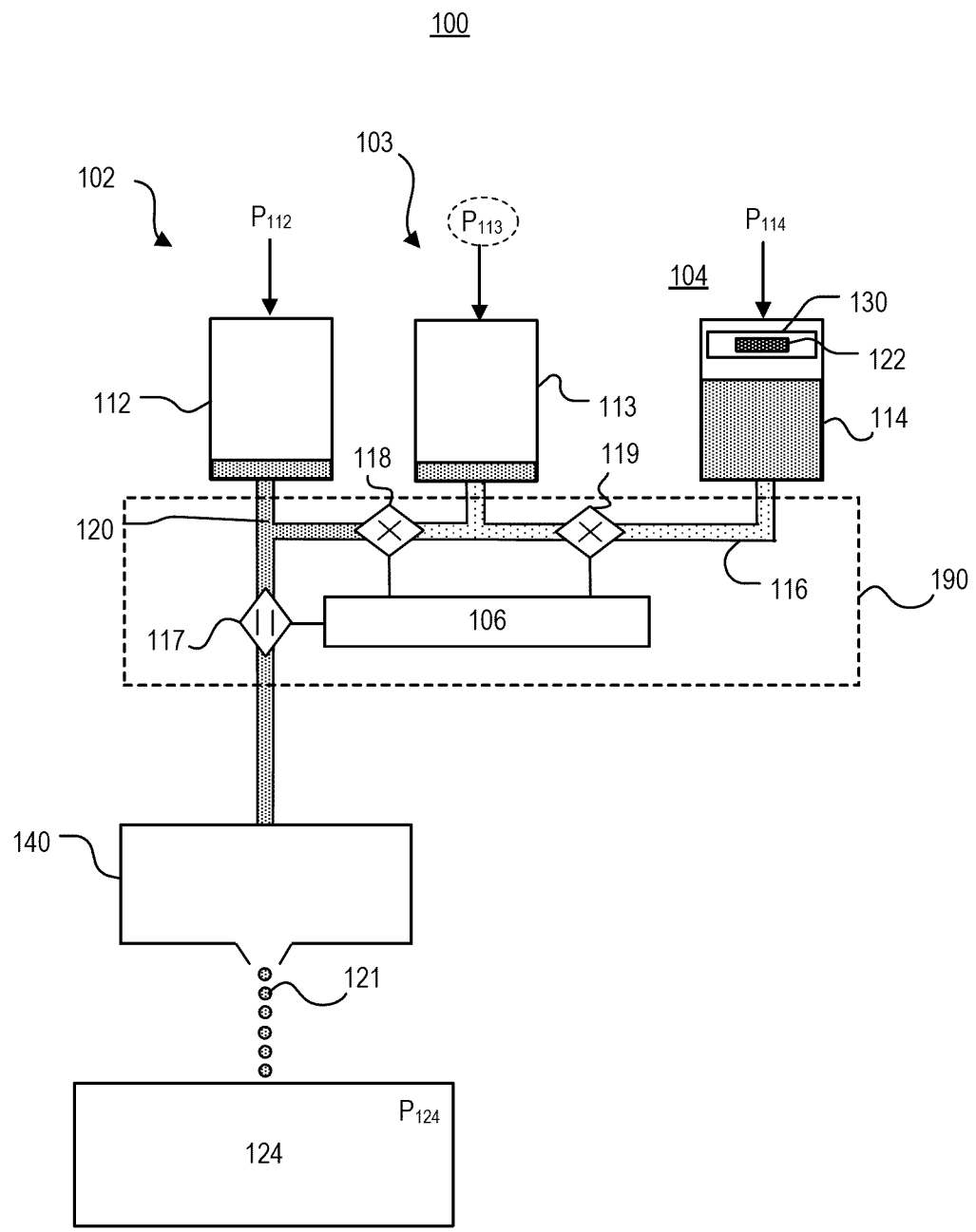
FIG. 9B is a block diagram showing a moment during the replenish mode of operation of the apparatus of FIG. 1, in which a fluid flow path between the first reservoir system and the second reservoir system is blocked and a fluid flow path between the second reservoir system and the priming system is blocked.
Figure 9C:
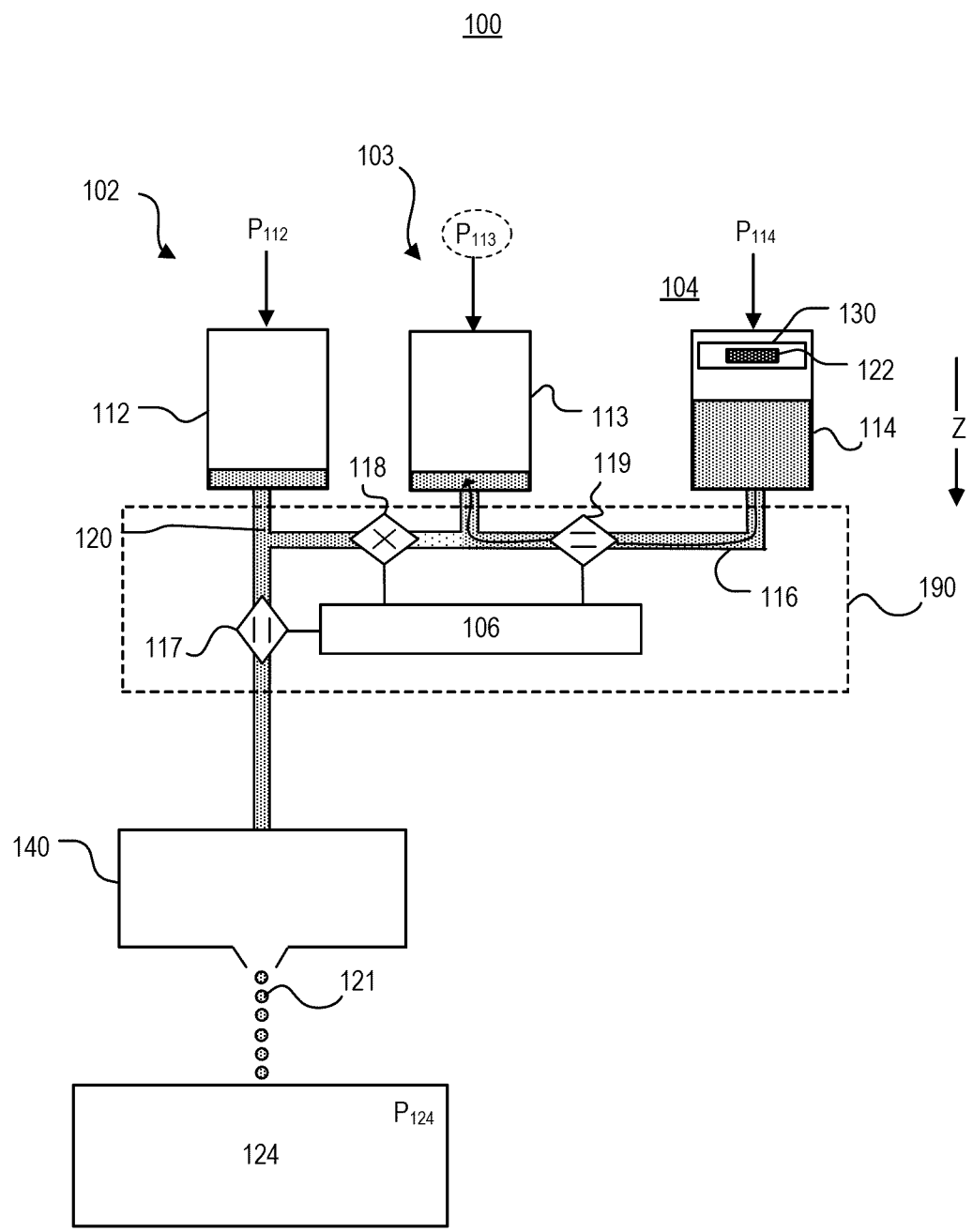
FIG. 9C is a block diagram showing a moment during the replenish mode of operation of the apparatus of FIG. 1, in which a fluid flow path between the first reservoir system and the second reservoir system is blocked and a fluid flow path between the second reservoir system and the priming system is open.

At the start of the replenish mode, as shown in FIG. 9B, the regulation device 118 is closed, thus acting to fluidly isolate the first fluid reservoir 112 and the nozzle supply system 140 on one side from the second fluid reservoir 113 on the other side. Once the regulation device 118 is closed, the environment control apparatus 236 depressurizes the second fluid reservoir 113, which means that the pressure $P_{113}$ applied to the second fluid reservoir 113 is brought to a suitable low pressure that can be close to or at atmospheric pressure. For example, the pressure $P_{113}$ can be depressurized to at or below 600 kPa. At this time, the pressure $P_{112}$ applied to the first fluid reservoir 112 remains high (such as at or above 6000 kPa or at a value between 6000-60,000 kPa) to enable the fluid target material 120 to continue to supply the nozzle supply system 140. Next, as shown in FIG. 9C, and once the pressure $P_{113}$ applied to the second fluid reservoir 113 has reached the suitable low pressure, the fluid controller 106 instructs the regulation device 119 to open to thereby permit fluid flow between the priming system 104 (specifically the priming tank 114) and the second fluid reservoir 113. Once the regulation device 119 is open, the fluid target material 120 freely flows from the priming tank 114 to the second fluid reservoir 113, as shown. The fluid target material 120 continues to flow into the second fluid reservoir 113 until the fluid target material 120 within the priming tank 114 drops below a threshold value (or until the fluid target material 120 is depleted from the priming tank 114). In some implementations, the priming tank 114 is able to store a volume of fluid target material 120 that exceeds a volume within the second fluid reservoir 113. In these implementations, it is possible to prevent the second fluid reservoir 113 from being overfilled with the fluid target material 120 by properly positioning the second fluid reservoir 113 and the priming tank 114 relative to each along the Z direction such that the lowest level of the fluid target material 120 within the priming tank 114 is always below the top of the second fluid reservoir 113.

As discussed above, in some implementations, the regulation device 119 is a freeze valve. In these implementations, in order to open the regulation device 119, the regulation temperature adjusting device heats the tube section of the regulation device 119 to a value above the melting point of the fluid target material 120 to melt any solid matter 122 that previously formed as a plug within the tube section of the regulation device 119 (when the regulation device 119 was closed). The solid matter 122 is thereby melted, and the fluid target material 120 can flow through the tube section.

Figure 9D:
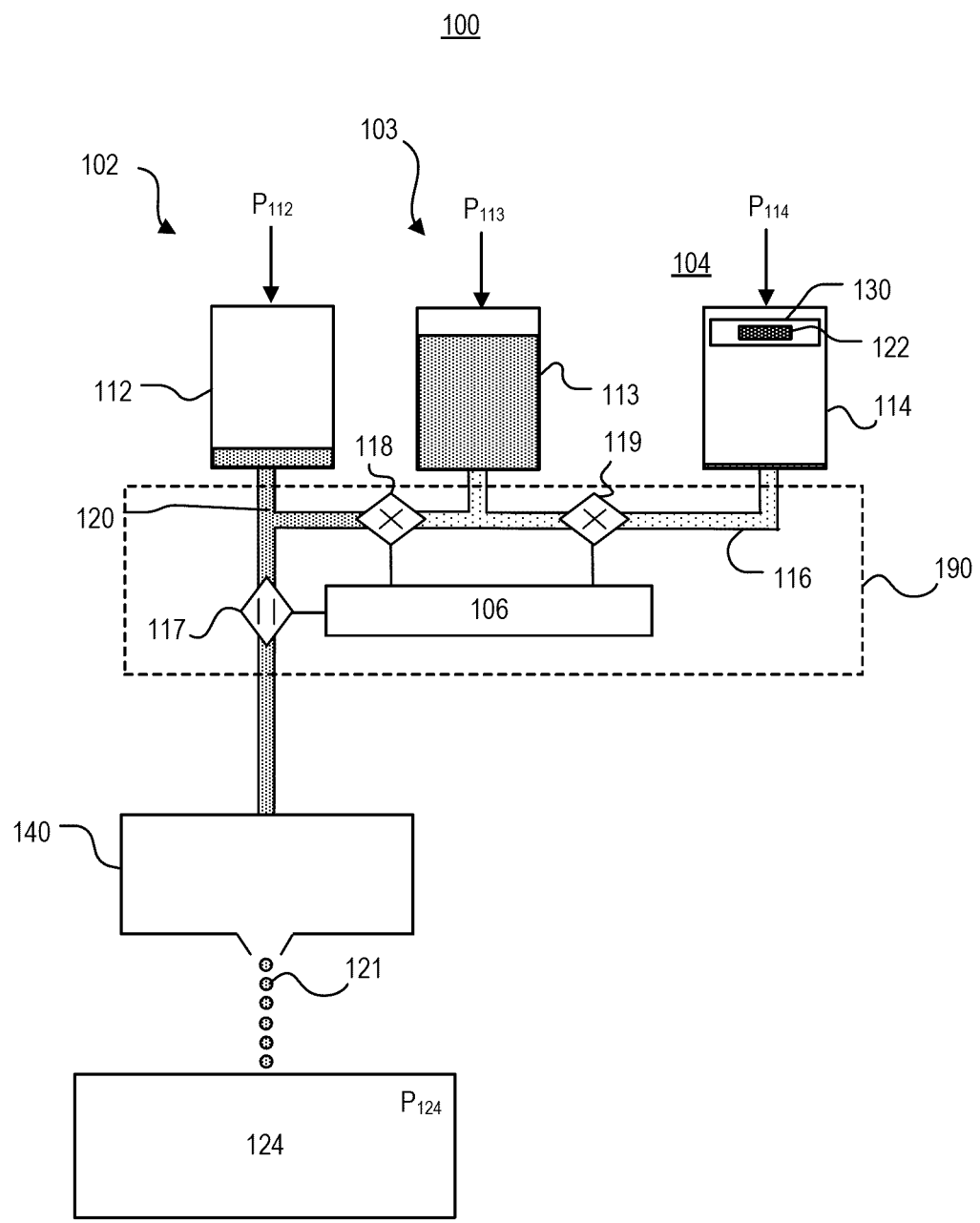
FIG. 9D is a block diagram showing a moment during the replenish mode of operation of the apparatus of FIG. 1, in which a fluid flow path between the first reservoir system and the second reservoir system is blocked and a fluid flow path between the second reservoir system and the priming system is blocked after the second reservoir system has been refilled with fluid target material from the priming system.
Figure 9E:
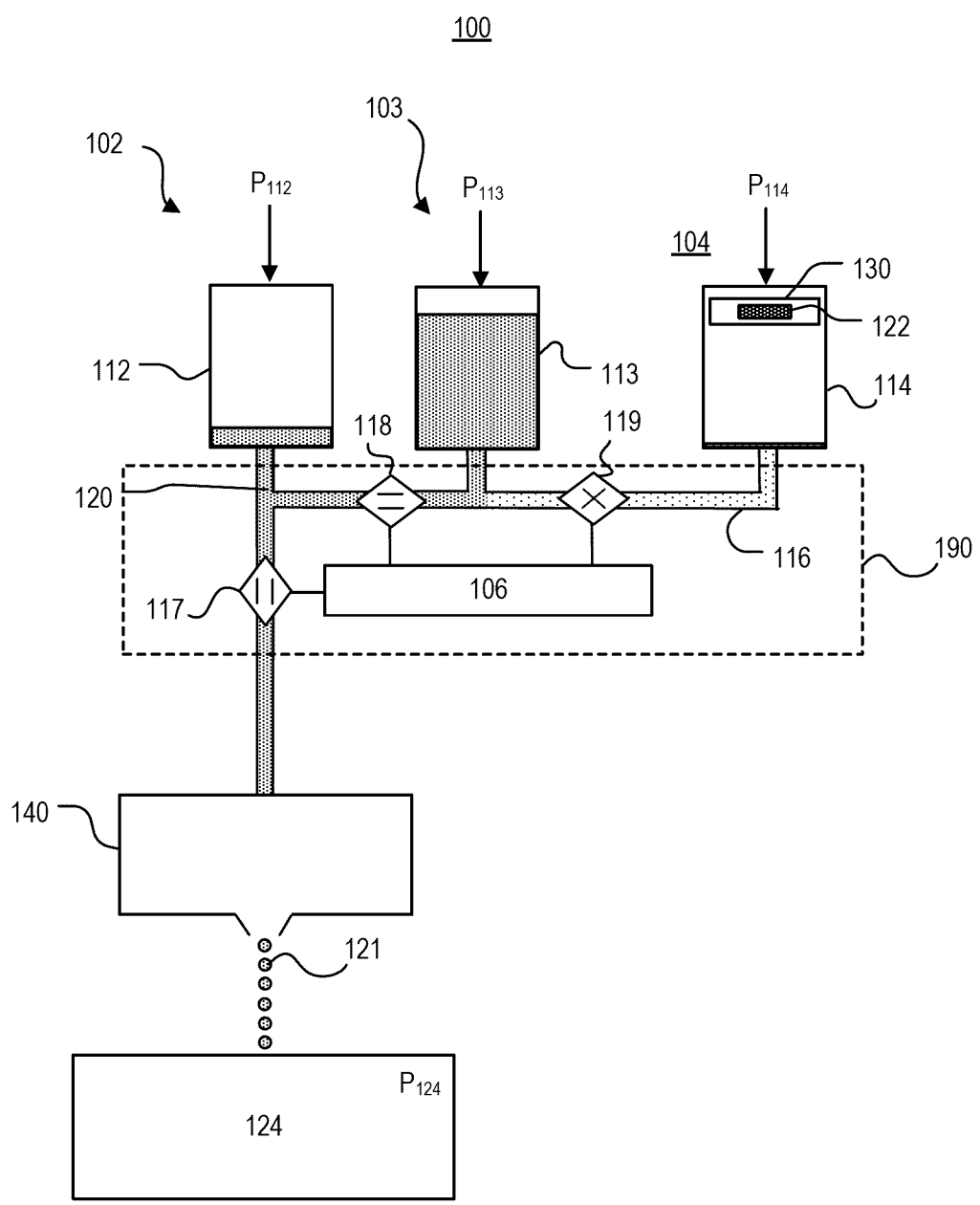
FIG. 9E is a block diagram showing a moment during the replenish mode of operation of the apparatus of FIG. 1, in which a fluid flow path between the first reservoir system and the second reservoir system is opened and a fluid flow path between the second reservoir system and the priming system is blocked.
Figure 9F:
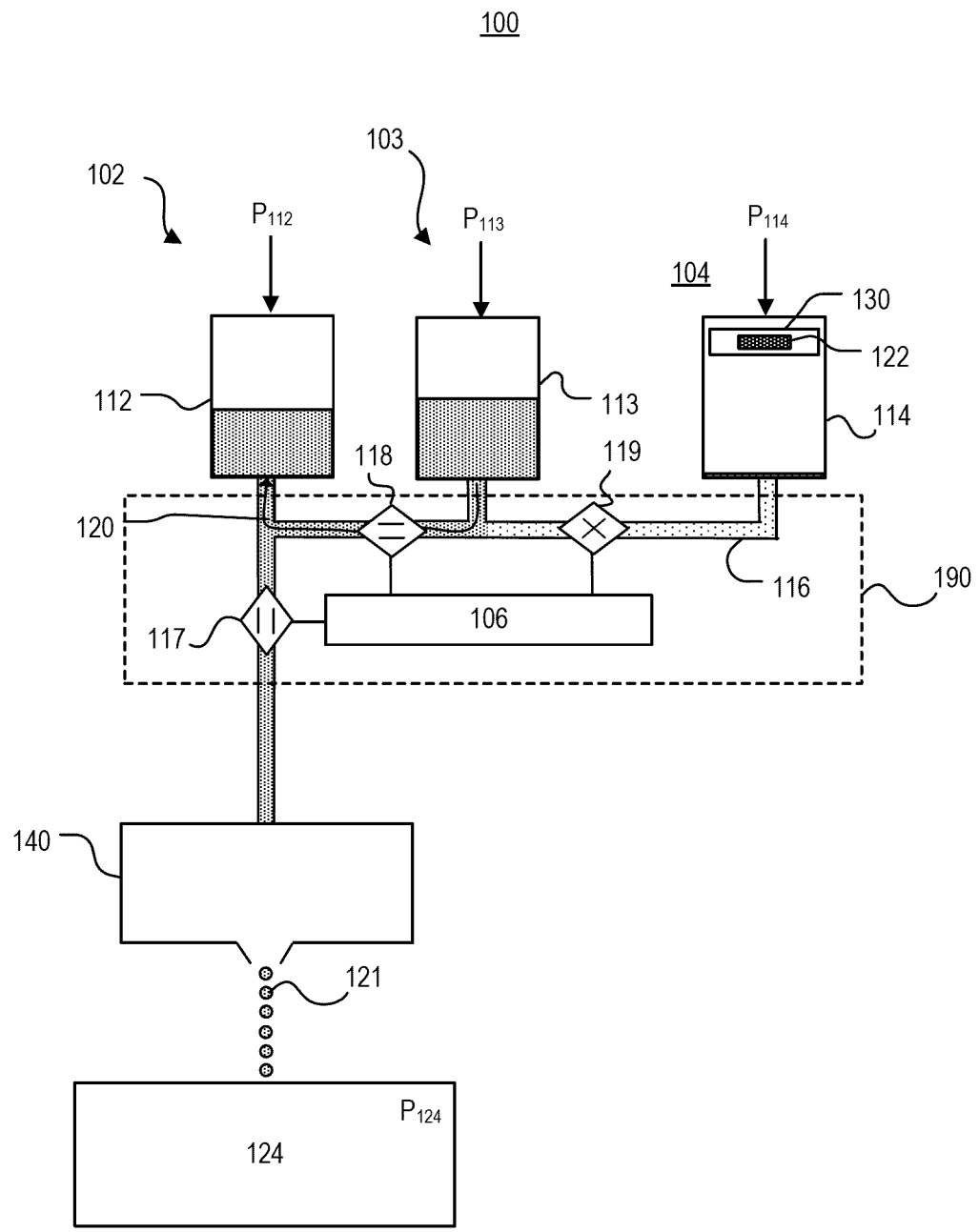
FIG. 9F is a block diagram showing a moment during the replenish mode of operation of the apparatus of FIG. 1, in which a fluid flow path between the first reservoir system and the second reservoir system is opened and a fluid flow path between the second reservoir system and the priming system is blocked, and the first reservoir system has been refilled with fluid target material from the second reservoir system.

Next, as shown in FIG. 9D, the fluid controller 106 instructs the regulation device 119 to close. In the implementations in which the regulation device 119 is a freeze valve, the regulation temperature adjusting device within the regulation device 119 cools the tube region of the regulation device 119 until the tube section reaches a temperature below the melting point of the fluid target material 120. Eventually, the fluid target material 120 solidifies within the tube section and forms a plug that prevents the flow of fluid target material 120 through the regulation device 119. Once the regulation device 119 has fully closed, the environment control apparatus 236 re-pressurizes the second fluid reservoir 113, which means that the pressure $P_{113}$ applied to the second fluid reservoir 113 is brought to a suitable high pressure that can be at or above 6000 kPa, or in a range from 6000-60,000 kPa. At this point in time, in some implementations, the pressure $P_{113}$ applied to the second fluid reservoir 113 can be the same as the pressure $P_{112}$ applied to the first fluid reservoir 112. Next, and once the pressure $P_{113}$ has reached the suitable high pressure, as shown in FIG. 9E, the fluid controller 106 instructs the regulation device 118 to open. The fluid target material 120 is enabled to flow from the second fluid reservoir 113 to the first fluid reservoir 112, as shown in FIG. 9F.

Figure 9G:
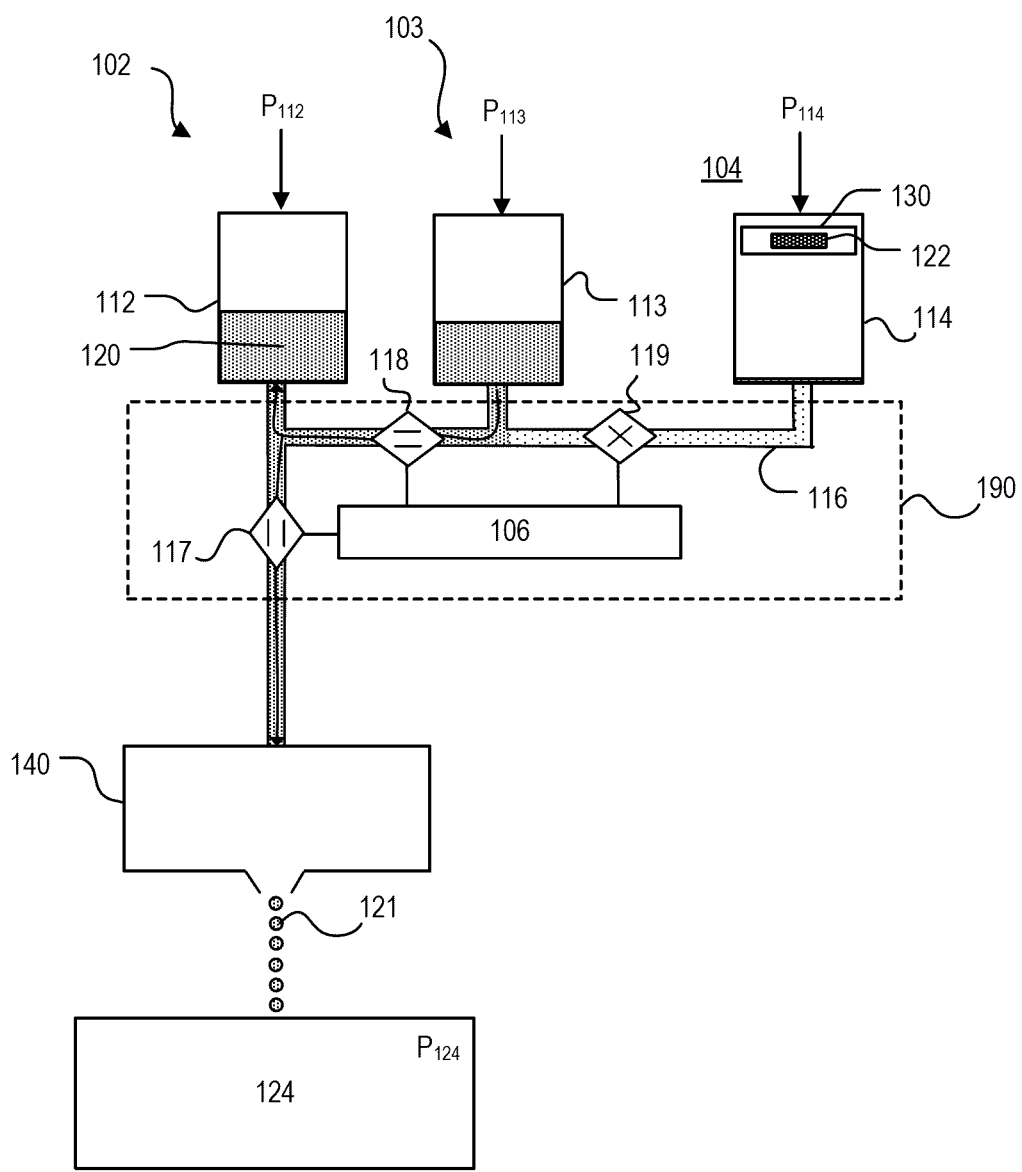
FIG. 9G is a block diagram showing a moment during the normal mode of operation of the apparatus of FIG. 1, in which a fluid flow path between the first reservoir system and the second reservoir system is opened and a fluid flow path between the second reservoir system and the priming system is blocked.

The replenishment mode ends and the normal mode of operation of the apparatus 100 resumes. In some implementations, as shown in FIG. 9G, at this time of the normal mode of operation, the fluid target material 120 can also be delivered from the second fluid reservoir 113 to the nozzle supply system 140 as well as from the first fluid reservoir 112 to the nozzle supply system 140.

While in the normal mode of operation, the priming system 104 can be engaged in priming (preparing) the fluid target material 120 from the solid matter 122. It is possible for the priming system 104 to prime the fluid target material 120 from the solid matter 122 on a regular frequency, or every several hours, every tens of hours, or every hundreds of hours. In some implementations, the priming system 104 can prime the fluid target material 120 from the solid matter 122 upon being instructed to do so.

At all times during the normal mode of operation and the replenishment mode of operation (throughout the steps shown in FIGS. 9A-9G), the fluid target material 120 is being supplied from the first fluid reservoir 112 to the nozzle supply system 140 enabling the nozzle supply system 140 to continuously produce the stream of targets 121 for use by the system 124.

The cycle described above with reference to FIGS. 9A-9G can repeat for continuous supply of the fluid target material 120 to the nozzle supply system 140 during operation of the nozzle supply system 140.

At some point during operation of the apparatus 100, it may become necessary to replace the nozzle assembly 542 of the nozzle supply system 540. In order to do this, the excess fluid target material 120 within the fluid communication apparatus 116 should be evacuated back into the first fluid reservoir 112 (or into the second fluid reservoir 113) from the flow path that extends to the nozzle assembly 542. In particular, with reference to FIG. 5, the fluid valve 533 is opened (while the nozzle valve system 545 is open), and, under control of the environment control apparatus 236, pressure $P_{531}$ is applied to gas within the gas line 532 and to the flow path extending from the nozzle assembly 542 back to the first fluid reservoir 112 (or the second fluid reservoir 113). If the fluid valve 533 is a freeze valve, then the temperature within the valve is raised to a level that is greater than the melting point of the fluid target material 120 to thereby open the fluid valve 533. The pressure $P_{531}$ applied to the gas within the gas line 532 is greater than the pressure $P_{112}$ applied to the first fluid reservoir 112 (or greater than the pressure $P_{113}$ applied to the second fluid reservoir 113). The higher pressure $P_{531}$ causes the fluid target material 120 to be pushed away from the nozzle assembly 542 and back toward the first fluid reservoir 112 or toward the second fluid reservoir 113 (when the regulation device 117 is open). At this point, the nozzle valve system 545 can be closed, the fluid valve 533 can be closed (by, for example, cooling) and the nozzle assembly 542 can be detached and replaced with a fresh nozzle assembly.

In this way, the nozzle assembly 542 can be replaced without requiring replacement of any of the first fluid reservoir 112, the second fluid reservoir 113, or the priming tank 114.

The application of pressure $P_{531}$ to the gas line 532 in combination with the high temperature $T_{534}$ can be great enough to clear fluid target material 120 from the flow path of the fluid communication apparatus 116 even beyond the first fluid reservoir 112, as long as all of the regulation devices 117, 118, 119 are open, and the fluid communication apparatus 116 is maintained at a temperature above the melting point of the fluid target material 120.

In summary, the above-described apparatuses 100, 200, 300, the procedures, and operational modes enable the nozzle supply system 140 to run continuously to supply the stream of targets 121 to the system 124, achieving performance specifications desired by the system 124 without requiring interruption to reload the solid matter 122 and prime/prepare the fluid target material 120 from the solid matter 122.

Because the first and second reservoirs 112, 113, and the priming system 104 can be fluidly and environmentally separated from the nozzle supply system 140, the time it takes to replace any component within the apparatus 100 can be reduced substantially, and also can take place even while the nozzle supply system 140 is producing the stream of targets 121, as long as one of the first or second reservoirs 112, 113 is supplying the fluid target material 120 to the nozzle supply system 140.

The newly added solid matter 122 is added to the priming system 104, which includes the priming chamber 130 that can be held at a low pressure during this time. And, the solid matter 122 is melting while in a pristine high vacuum environment within the priming chamber 130 to prevent or reduce oxidation within the fluid target material 120.

If any of the fluid transmission lines 115 or regulation devices 117, 118, 119 within the fluid communication apparatus 116 needs to be disconnected for maintenance or repair, it is possible to perform such a disconnection after the fluid target material 120 is first cleared from the fluid communication apparatus 116 by controlling the pressure at various locations along the path toward the nozzle supply system 140. As discussed above, for example, to clear the fluid flow path from the nozzle supply system 140 to the first fluid reservoir 112, the gas line 532 can be pressured (to a pressure greater than the pressure $P_{112}$) while the regulation device 117 is open.

As another example, to clear the fluid flow path from the first fluid reservoir 112 to the second fluid reservoir 113, the pressure $P_{112}$ can be increased to a value greater than the pressure $P_{113}$, while the regulation device 118 is open (and the regulation device 117 is closed). Lastly, to clear the fluid flow path from the second fluid reservoir 113 to the priming system 104, the pressure $P_{113}$ can be increased to a value greater than the pressure $P_{114}$, while the regulation device 119 is open (and the regulation device 118 is closed). Similar to the gas interface provided by way of the fluid valve 533 at the nozzle supply system 540, another gas interface can be provided between the priming tank 114 and the second fluid reservoir 113 to push the fluid target material 120 from the priming tank 114 into the second fluid reservoir 113 (while maintaining the regulation device 119 as open and the regulation device 118 as closed). Once the priming tank 114 is cleared of the fluid target material 120, the regulation device 119 can be closed and then the priming tank 114 can be replaced.

The elimination of the fluid target material 120 from within the fluid transmission lines 115 and the regulation devices 117, 118, 119 enables a modular architecture within the apparatus 100. In this way, not all of the components within the apparatus 100 and the nozzle supply system 140 need to be replaced when only one component within the apparatus 100 is non-performing. For example, only a non-performing nozzle supply system 140 needs to be replaced (without having to replace the components within the apparatus 100). As another example, only the non-performing reservoir (either the first fluid reservoir 112 or the second fluid reservoir 113) needs to be replaced without having to replace the other fluid reservoir or the priming system 104 or the nozzle supply system 140 (or even disrupting operation of the nozzle supply system 140).

It is also possible to maintain any component that is operating at a low pressure (for example, around or near atmospheric pressure) at a relatively colder environment (such as around room temperature). Additionally, the reload of the solid matter 122 can occur in this low pressure/cold environment even while the first fluid reservoir 112 is operating at high pressure to supply the fluid target material 120 to the nozzle supply system 140.

The apparatus 100, 200, 300, procedures, and operational modes enable the nozzle supply system 140 to be in operation and supplying the stream of targets 121 at least 80% of the time, at least 90% of the time, or at least 99% of the time (for example, 99.2% of the time). The mean time it takes to replace a nozzle assembly 542 is reduced to less than 6 hours, less than 5 hours, or about 4.5 hours when compared to what was previously achievable. This leads to a reduction in cost of ownership over time as well as a reduction in service labor hours to repair the apparatus or the nozzle supply system 140.

Figure 10:
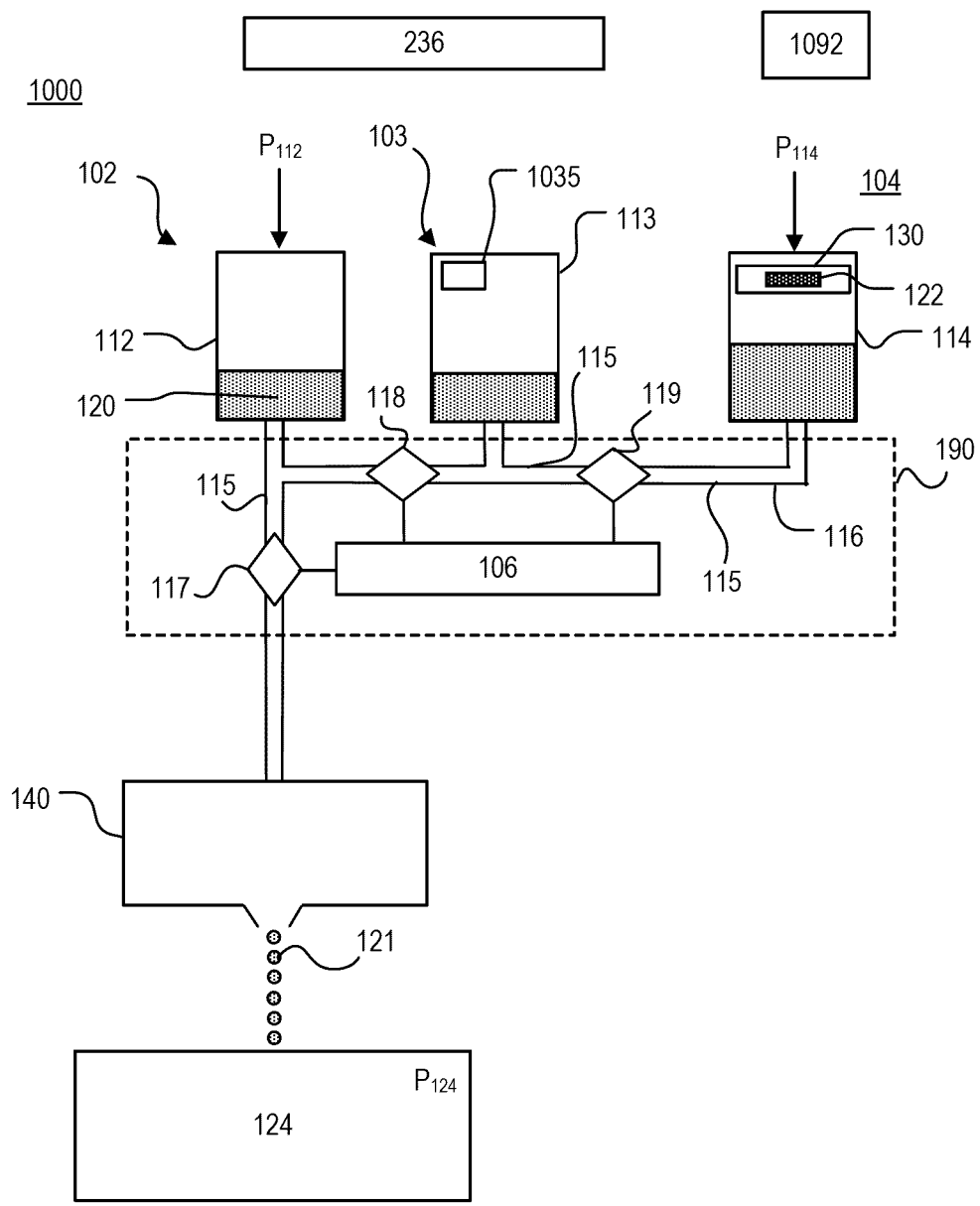
FIG. 10 is a block diagram of another implementation of the apparatus of FIG. 1, including a level sensing apparatus configured to estimate the volume of the fluid target material in the second reservoir system.

In some implementations, and referring to FIG. 10, the apparatus 100 is an apparatus 1000 that also includes a level sensing apparatus 1035 configured to estimate the volume of the fluid target material 120 in the second fluid reservoir 113 at various points in time during the normal mode of operation or during the replenish mode of operation. The level sensing apparatus 1035 can utilize one or more of electrical, magnetic, and ultrasonic components to achieve an estimate the volume or level of the fluid target material 120. The level sensing apparatus 1035 can be any device that is able to withstand the pressure $P_{113}$ applied to the second fluid reservoir 113. Moreover, in some implementations, the apparatus 1000 can include another level sensing apparatus 1035 configured to estimate a volume of the fluid target material 120 in the first fluid reservoir 112.

The level sensing apparatus 1035 can, in some implementations, include one or more high pressure transducers. While the following discussion only mentions one high pressure transducer, the level sensing apparatus 1035 is not limited to having only one high pressure transducer. The level sensing apparatus 1035 can include a transducer that can operate at high pressure (such as at the pressure at which the second fluid reservoir 113 can operate) and is included in the second fluid reservoir 113.

The high pressure transducer is a pressure sensor that measures the pressure of the gas within the second fluid reservoir 113. The high pressure transducer 1035 generates a signal as a function of the pressure imposed on it. The high pressure transducer 1035 can measure the pressure of the gas that is inside the second fluid reservoir 113 such that when the volume of the fluid target material 120 in the second fluid reservoir 113 changes, the pressure of the gas inside the second fluid reservoir 113 (and above the fluid target material 120) also changes. For example, when the second fluid reservoir 113 is being filled with the fluid target material 120 such that the volume of the fluid target material 120 is increasing (such as during the replenish mode as shown in FIGS. 9C and 9D), the gas in the second fluid reservoir 113 (and above the fluid target material 120) is slowly compressed inside the second fluid reservoir 113.

The high pressure transducer 1035 can be useful, as follows. Specifically, the environment control apparatus 236 can set up a pressure differential between the second fluid reservoir 113 and the priming tank 114 in order to promote a faster transfer of the fluid target material 120 from the priming tank 114 to the second fluid reservoir 113. Specifically, the environment control apparatus 236 can ensure that the pressure $P_{114}$ applied to the priming tank 114 is higher than the pressure $P_{113}$ applied to the second fluid reservoir 113 prior to performing the step shown in FIG. 9C. For example, the pressure $P_{114}$ in the priming tank 114 can be 100-200 kPa greater than the pressure $P_{113}$ in the second fluid reservoir 113. Because the environment control apparatus 236 is applying this pressure differential, the second fluid reservoir 113 is more rapidly filled, and it can be important to ensure that the second fluid reservoir 113 is not overfilled with the fluid target material 120.

In this way, the high pressure transducer 1035 enables a control system 1092 within the apparatus 1000 (such control system 1092 could include aspects or components of the environment control apparatus 236 and/or the fluid controller 106) to track or monitor the change of volume of the fluid target material 120 in the second fluid reservoir 113. The output of the high pressure transducer 1035 can be an electrical signal that represents the amount of matter of the fluid target material 120 in the second fluid reservoir 113. And, this output can be analyzed by the control system 1092 to determine when to close the regulation device 119 or when a next refill or replenishment of fluid target material 120 is needed. For example, the control system 1092 can instruct the fluid controller 106 to reload the priming tank 114 whenever the level of fluid target material 120 within the second fluid reservoir 113 drops below a particular level.

The control system 1092 can use the following equation to estimate the volume of the fluid target material 120 in the second fluid reservoir 113:

$$(P_{113})i \times [V_{113} - (V_{120})i] < (P_{113})f \times [V_{113} - (V_{120})i - VT],$$

where $(P_{113})i$ is the initial pressure of the second fluid reservoir $(P_{113})i$ (which is known prior to the start of the refill at FIG. 9C); $V_{113}$ is the total volume of the second fluid reservoir (which is known); $(V_{120})i$ is the initial volume of the fluid target material 120 that was remaining in the second fluid reservoir (prior to the start of the refill at FIG. 9C); $(P_{113})f$ is the current pressure in the second fluid reservoir 113, which is the output from the high pressure transducer 1035; and Vt is the volume of the fluid target material 120 that has been transferred from the priming tank 114 to the second fluid reservoir 113. Vt can be determined from a level sensor in the priming tank 114. In other implementations, other relationships and parameters can be used to estimate the volume of the fluid target material 120 in the second fluid reservoir 113.

As the fluid target material 120 flows from the priming tank 114 to the second fluid reservoir 113 (such as shown in FIG. 9C), the output $(P_{113})f$ of the high pressure transducer 1035 continuously changes, and with each new value, the control system 1092 obtains a series of measurements of the pressure $P_{113}$, and this information can be used to understand, for example, the volume Vt of the fluid target material 120 that has been transferred to the second fluid reservoir 113 and/or the initial volume $(V_{120})i$ of fluid target material 120 remaining in the second fluid reservoir 113. By understanding how much fluid target material 120 remains in the second fluid reservoir 113 and also how much fluid target material 120 was remaining in the first fluid reservoir 112 prior to the refill (prior to the step shown in FIG. 9C), the control system 1092 can determine an amount of the fluid target material 120 used per time period (a rate of consumption of fluid target material 120). The control system 1092 can use the determined consumption rate to determine when to instruct the fluid controller 106 to trigger a refill in the second fluid reservoir 113. In this way, the first fluid reservoir 112 can continuously provide a source of the fluid target material 120 to the nozzle supply system 140 at all times during operation of the nozzle supply system 140. The information from the pressure transducer 1035 can also be used to estimate a total amount of fluid target material 120 that remains in the first fluid reservoir 112 and the second fluid reservoir 113.

In addition, and in the implementations described, when the high pressure transducer 1035 monitors the volume of the fluid target material 120 in the second fluid reservoir 113, overfilling of the second fluid reservoir 113 with the fluid target material 120 from the priming tank 114 can be prevented. For example, when the high pressure transducer 1035 reaches a stable state, the compression of the gas within the second fluid reservoir 113 has reached an upper limit. As such, the second fluid reservoir 113 has been fully filled with the fluid target material 120. The fluid control system 1092 can then prevent the fluid target material 120 from continuing to flow between the priming system 104 and the second fluid reservoir 113. In this way, the second fluid reservoir 113 can be prevented from overfilling with the fluid target material 120.

In these implementations, after the fluid target material 120 has been transferred from the priming tank 114 to the second fluid reservoir 113 (that is, after the step shown in FIG. 9C is completed), and before the first fluid reservoir 112 and the second fluid reservoir 113 are connected by opening the regulation device 118 (that is, before the step shown in FIG. 9E has begun), a calculation can be performed by the control system 1092. The calculation includes estimating the volume of the fluid target material 120 that has transferred from the priming tank 114 to the second fluid reservoir 113, Vt, using the equation described above (FIG. 10). Further, the control system 1092 can also calculate the total volume $(V_{120})t$ of the fluid target material 120 contained within the second fluid reservoir 113 in accordance with the flowing equation:

$$(V_{120})t = (V_{120})i + Vt.$$

The total volume $(V_{120})t$ of the fluid target material 120 in the second fluid reservoir 113 is calculated as the sum of the initial volume $(V_{120})i$ of the fluid target material 120 remaining in the second fluid reservoir 113 and the volume Vt of the fluid target material 120 that has been transferred from the priming tank 114 to the second fluid reservoir. The control system 1092 can also estimate the height of the fluid target material 120 in the second fluid reservoir 113 based on the total volume $(V_{120})t$ of the fluid target material 120 in the second fluid reservoir and the known dimensions of the inside of the second fluid reservoir 113.

In the implementations described, the control system 1092 can also perform these same calculations for the first fluid reservoir 112.

Once the height of the fluid target material 120 is known or estimated in both of the first fluid reservoir 112 and the second fluid reservoir 113, then the control system 1092 can estimate or calculate a height difference Δh. The height difference Δh is the height of the fluid target material 120 in the second fluid reservoir 113 minus the height of the fluid target material 120 in the first fluid reservoir 112. The control system 1092 can calculate a head pressure ΔPh based on the estimated height difference Δh using the following equation:

$$\Delta Ph = \rho 120 \times g \times \Delta h,$$

where ρ120 is equal to the density of the fluid target material 120, and g is the gravitational force constant.

The control system 1092 can instruct the environment control apparatus 236 to control the second pressure $P_{113}$ of the second fluid reservoir 113 based on the calculated head pressure ΔPh. For example, the environment control apparatus 236 can pressurize the second fluid reservoir 113 so that its pressure $P_{113}$ is equal to the difference between the first pressure $P_{112}$ of the first fluid reservoir 112 and the head pressure ΔPh. All of this can take place during operation of the nozzle supply system 140, and the control system 1092 can repeatedly perform this calculation and instruct the environment control apparatus 236 to adjust or reset the second pressure $P_{113}$ of the second fluid reservoir 113. In this way, the levels (or heights) of the fluid target material 120 in the first fluid reservoir 112 and the second fluid reservoir 113 can be maintained while the fluid target material 120 is continuously supplied to the nozzle supply system 140.

Moreover, the control system 1092 can calculate a total amount of fluid target material 120 within the apparatus 1100 that is available until the replenishment is needed by analyzing an amount of fluid target material 120 within each of the first fluid reservoir 112 and the second fluid reservoir 113; an amount of time during which the first fluid reservoir 112 has been supplying the fluid target material 120 to the nozzle supply system 140; and an amount of fluid target material 120 that is transferred from the priming tank 114.

Figure 11:
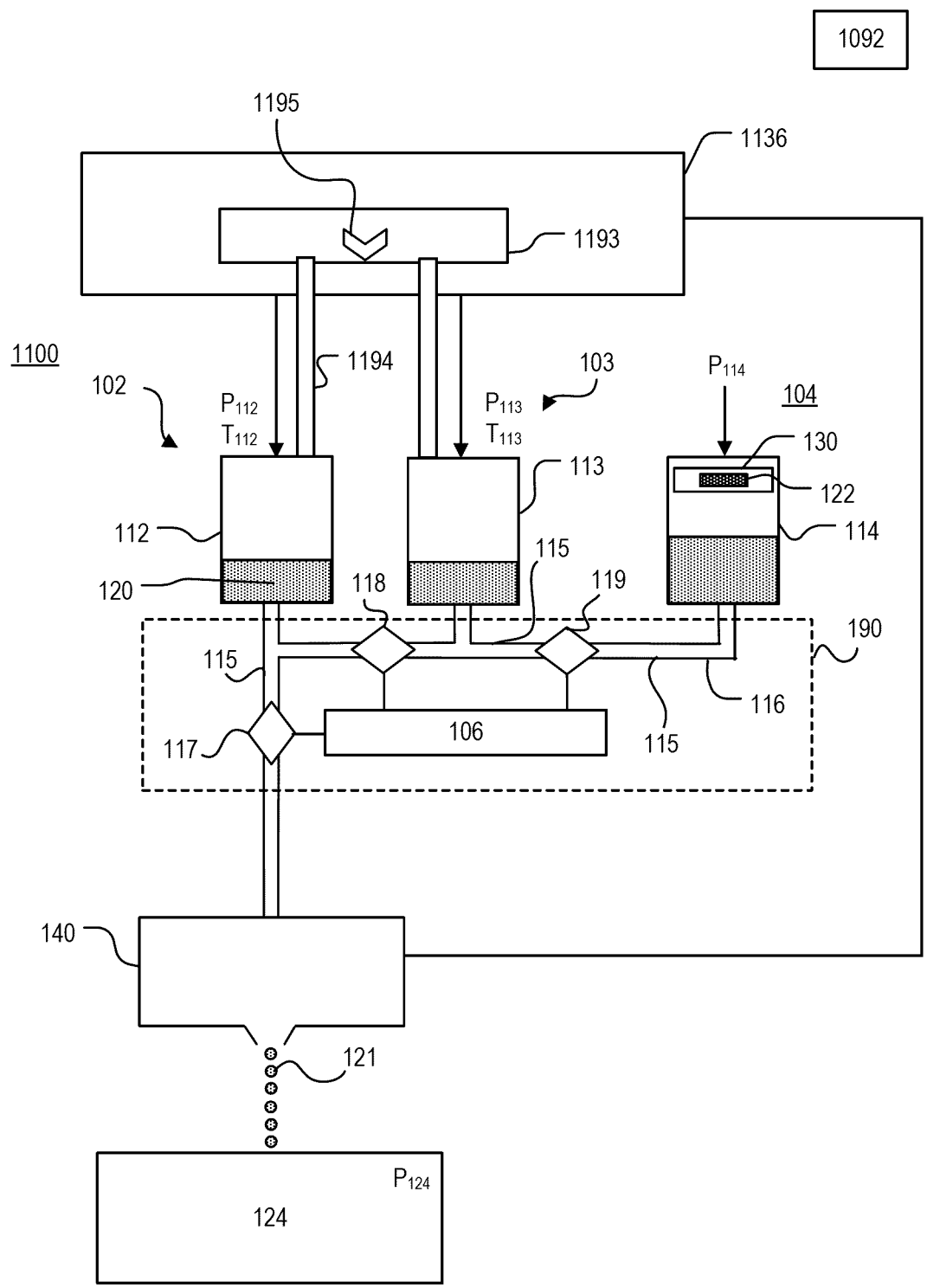
FIG. 11 is a block diagram of another implementation of the apparatus of FIG. 1, in which an environment control apparatus is fluidly connected to the first reservoir system and the second reservoir system by way of a fluid communication connection.

In another implementation 1100 of the apparatus, as shown in FIG. 11, the environment control apparatus 236 is an environment control apparatus 1136 that includes a pressurized reservoir 1193. The environment control apparatus 1136 is fluidly connected to the first fluid reservoir 112 and the second fluid reservoir 113 by way of a fluid communication connection 1194. The pressurized reservoir 1193 contains an inert gas that can be transferred from the pressurized reservoir 1193 to the first fluid reservoir 112 and/or the second fluid reservoir by way of the fluid communication connection 1194 by opening an orifice 1195. The orifice 1195 can have a determined size such that when the orifice 1195 is opened, the orifice 1195 allows the gas in the pressurized reservoir 1193 to transfer from the pressurized reservoir 1193 to the first fluid reservoir 112 and/or the second fluid reservoir 113 at a slow rate.

In this implementation, and referring to FIG. 11, the level (or height) of the fluid target material 120 can be measured indirectly by releasing a certain volume of the gas from the pressurized reservoir 1193 through the open orifice 1195 into the first fluid reservoir 112 and the second fluid reservoir 113. The drop in the pressure of the pressurized reservoir 1193 can be measured, and the volume of the gas that has been transferred from the pressurized reservoir 1193 to the first fluid reservoir 112 and the second fluid reservoir 113 can be estimated. The volume of the gas that has been transferred from the pressurized reservoir 1193 can be used to estimate the volume of the fluid target material 120 that remains in the first fluid reservoir 112 and the second fluid reservoir 113. For example, the volume of the gas that has been transferred from pressurized reservoir 1193 can be estimated from the total pressure drop in the first fluid reservoir 112 and/or the second fluid reservoir 113 as well as from a measured final pressure (at the first fluid reservoir 112 and/or the second fluid reservoir 113). The volume of the fluid target material 120 that remains in the first fluid reservoir 112 and the second fluid reservoir 113 can then be calculated as the difference of the volume of gas that has been transferred from the pressurized reservoir 1193 and the total volume of the first fluid reservoir 112 and the second fluid reservoir 113 combined.

In the implementation described, the gas pressure $P_{113}$ applied to second fluid reservoir 113 can be lower than the gas pressure $P_{112}$ applied to the first fluid reservoir 112, such that the second pressure $P_{113}$ is less than the first pressure $P_{112}$.

Additionally, the head pressure $PH_{112}$ of the fluid target material 120 within the first fluid reservoir 112 is the pressure exerted from the column of fluid target material 120 to the base of the first fluid reservoir 112, and the head pressure $PH_{113}$ of the fluid target material 120 within the second fluid reservoir 113 is the pressure exerted from the column of the fluid target material 120 to the base of the second fluid reservoir 113. Prior to opening the orifice 1195, the total pressure (given by $P_{112}+PH_{112}$) in the first fluid reservoir 112 is equal to the total pressure (given by $P_{113}+PH_{113}$) in the second fluid reservoir 113. Nevertheless, because the gas pressure $P_{112}$ in the first fluid reservoir 112 is higher than the gas pressure $P_{113}$ in the second fluid reservoir 113, the inert gas leaks into the second fluid reservoir 113, while the column of the fluid target material 120 in the second fluid reservoir 113 flows into the first fluid reservoir 112 once the environment control apparatus 1136 opens the orifice 1195.

The difference in gas pressures of the first fluid reservoir 112 and the second fluid reservoir 113 (namely, $P_{112}-P_{113}$) allows the fluid target material 120 to flow from the second fluid reservoir 113 to the first fluid reservoir 112 at a specific rate. The flow rate of the fluid target material 120 from the second fluid reservoir 113 to the first fluid reservoir 112 is controlled by the flow rate of the inert gas transferred from the pressurized reservoir 1193 to the first fluid reservoir 112 (as this controls the pressure of the gas inside the first fluid reservoir 112). While the inert gas transfers into the second fluid reservoir 113, it is still at a higher pressure than the gas pressure within the second fluid reservoir 113 and this difference in pressure is vented out by a gas control system that is connected to the second fluid reservoir 113 so that the gas pressure in the second fluid reservoir 113 is maintained and the fluid target material 120 can continue to be delivered to the nozzle supply system 140 while at the same time fluid target material 120 can be supplied to the first fluid reservoir 112. In this way, the flow rate of the fluid target material 120 from the second fluid reservoir 113 to the first fluid reservoir 112 can be controlled, ensuring that the formation of the stream of targets 121 from the nozzle supply system 140 is not adversely affected by upstream instabilities in the flow of the fluid target material 120.

Figure 12:
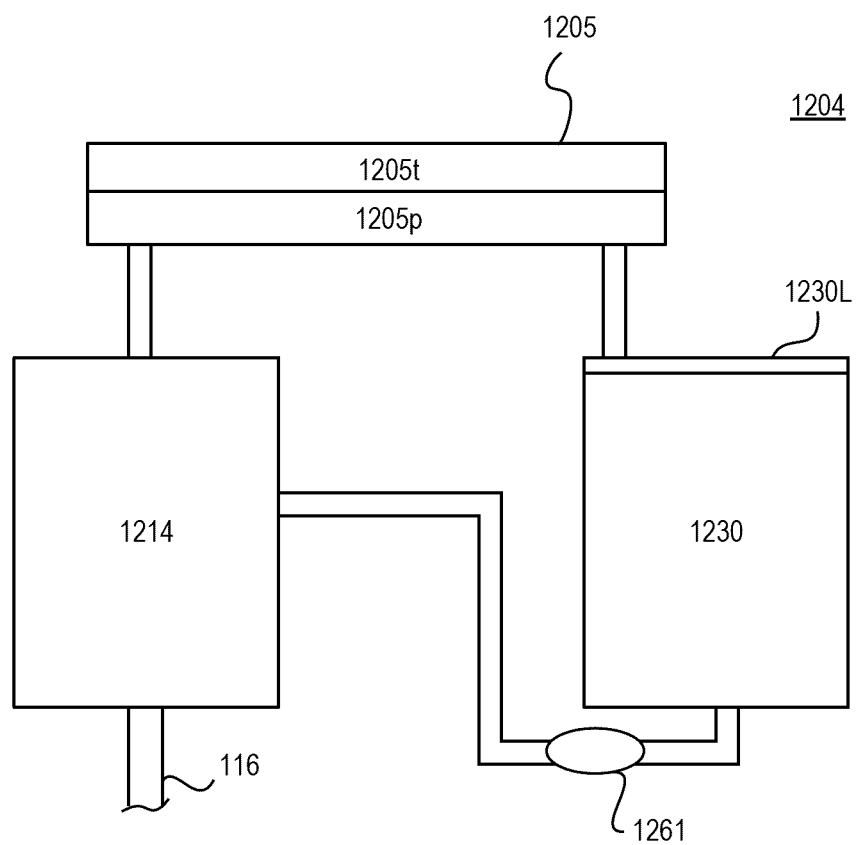
FIG. 12 is a block diagram of another implementation of the priming system of FIG. 1.

Referring to FIG. 12, the priming system 104 is designed as a priming system 1204. The priming system 1204 is effectively acts as a phase change vacuum pass through that includes just two volumes, one volume defined by the priming chamber 1230 (which receives the solid matter 122) and one volume defined by the priming tank 1214, and a single flow blocking device 1261, which can, in some implementations, be a freeze valve. The flow blocking device 1261 acts as the fluid transport system 461 between the priming chamber 1230 and the priming tank 1214.

The priming system 1204 can further include an environment control apparatus 1205. In some implementations, the environment control apparatus 1205 includes a pressure system 1205p configured to adjust a relative or differential pressure between the two volumes so that fluid target material 120 is pushed from the priming chamber 1230 to the priming tank 1214. In other implementations, the priming chamber 1230 is arranged above the priming tank 1214 and the force of gravity causes any fluid target material 120 to drop from the priming chamber 1230 to the priming tank 1214. The environment control apparatus 1205 also includes a temperature system 1205t configured to adjust a temperature of the freeze valve 1261 as well as the priming chamber 1230 and the priming tank 1214.

The priming system 1204 lacks any other internal valves between the priming chamber 1230 and the priming tank 1214. Yet, the priming system 1204 uses a phase change (between a liquid and a solid) to transfer a material into a vacuum environment. In this case, the fluid target material 120 is transferred into the vacuum environment of the priming tank 1214. Despite the simplicity of the design, the priming system 1204 is configured to avoid exposing the fluid target material 120 to ambient air, such exposure potentially producing unwanted contaminants into the fluid target material 120.

Figure 13A:
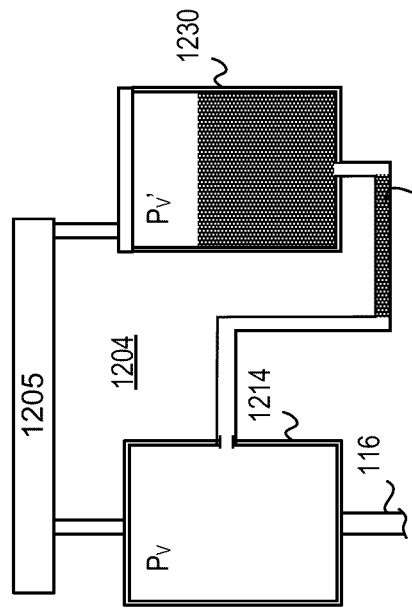
FIGS. 13A-13D are block diagrams of the priming system of FIG. 12 at various stages during priming of a solid matter into a fluid target material.

Referring to FIGS. 13A-13D, a procedure is performed. Initially, as shown in FIG. 13A, a door or lid 1230L on the priming chamber 1230 is opened and the solid matter 122 is inserted into the volume of the priming chamber 1230. At this time, the pressure system 1205*p* of the environment control apparatus 1205 maintains a pressure of the priming tank 1214 at a vacuum level $P_V$ (below atmospheric pressure) while the pressure of the priming chamber 1230 is opened to air/atmosphere $P_A$. Additionally, the temperature system 1205*t* the priming chamber 1230 and the freeze valve 1261 are at a temperature below the melting point of the solid matter 122.

Figure 13B:
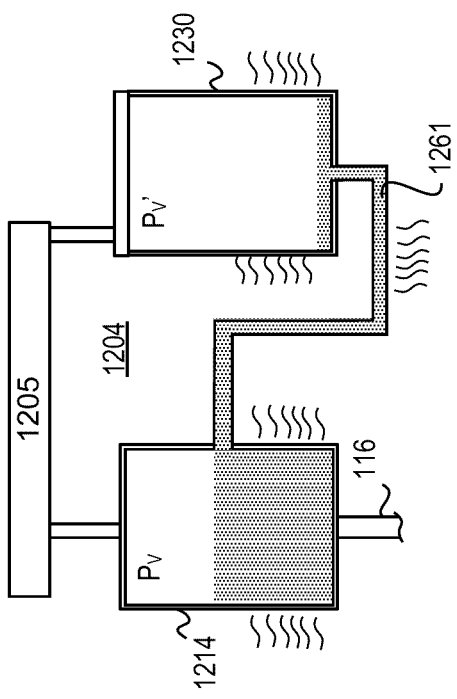

As shown in FIG. 13B, once the solid matter 122 is inside the volume of the priming chamber 1230, the lid 1230L is closed. Then, the pressure system 1205*p* pumps the volume of the priming chamber 1230 to a level $P_V'$ that is below atmospheric pressure. The pressure $P_V'$ of the priming chamber 1230 can be at a level that is greater than the pressure $P_V$ of the priming tank 1214 or the pressure $P_V'$ of the priming chamber 1230 can be the same as the pressure $P_V$ of the priming tank 1214 (if gravity is used to affect flow).

Figure 13C:
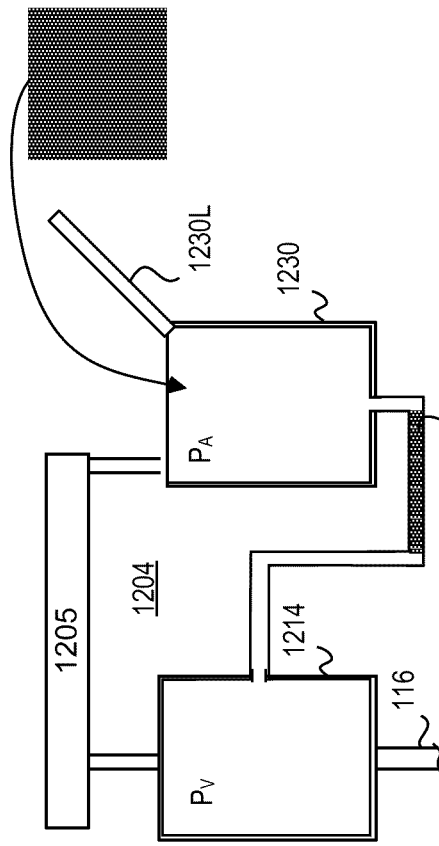

As shown in FIG. 13C, the temperature system 1205*t* heats the solid matter 122 within the priming chamber 1230 to a temperature great enough to melt the solid matter 122 and form fluid target material 120.

Figure 13D:
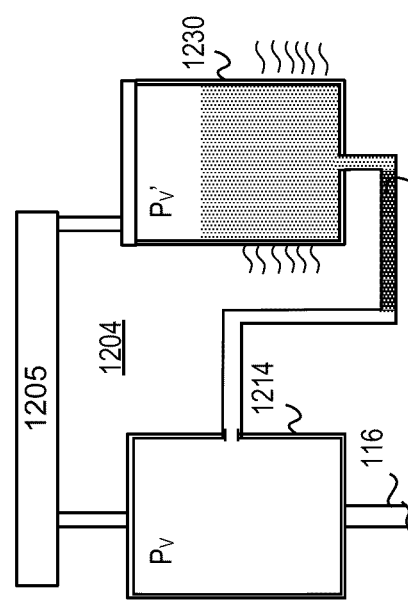

Then, as shown in FIG. 13D, the temperature system 1205*t* heats the freeze valve 1261 to a temperature great enough to melt the solid matter within the freeze valve 1261 into the fluid target material 120. If needed, the temperature system 1205*t* can additionally heat the priming tank 1214 to ensure that it is at a temperature great enough to maintain the fluid state of the fluid target material 120. Because the pressure $P_V'$ within the priming chamber 1230 is greater than the pressure $P_V$ within the priming tank 1214 (by an amount that is great enough to overcome any competing forces such as the force of gravity and surface tension), the fluid target material 120 flows out of the priming chamber 1230 and into the priming tank 1214. Alternatively, this flow can happen by way of gravity if the priming chamber 1230 is positioned above the priming tank 1214 and the pressure in the priming chamber 1230 is equal to the pressure in the priming tank 1214.

Once all of the fluid target material 120 has flowed into the priming tank 1214, the temperature system 1205*t* cools the freeze valve 1261 to a temperature below the melting point of the fluid target material 120, and any remaining fluid target material 120 within the freeze valve 1261 solidifies and forms a fluid (and pressure) barrier so that the process can start over again as shown in FIG. 13A.

Other implementations are within the scope of the following claims. For example, and with reference again to FIG. 1, in some implementations, it is possible to configure the priming tank 114 of the priming system 104 to operate at high pressures at various states. For example, after the priming system 104 has produced enough of the fluid target material 120, the priming tank 114 can begin operating at a high pressure that corresponds to the high pressure applied to the second fluid reservoir 113, and a fluid flow path can be established between the second fluid reservoir 113 and the priming tank 114 while operating at this high pressure.

Other aspects of the invention are set out in the following numbered clauses.

1. An apparatus for supplying a target material, the apparatus comprising: a first reservoir system comprising a first fluid reservoir configured to be in fluid communication with a nozzle supply system during operation of the nozzle supply system, the first fluid reservoir maintained at a first pressure;
a second reservoir system comprising a second fluid reservoir configured to be, at least part of the time during operation of the nozzle supply system, in fluid communication with the first reservoir system;
a priming system configured to receive a solid matter that includes a target material and to produce a fluid target material from the solid matter, the priming system maintained at a priming pressure that is less than the first pressure; and
a fluid control system fluidly connected to the priming system, the first reservoir system, the second reservoir system, and the nozzle supply system, wherein the fluid control system is configured to:
isolate at least one fluid reservoir and the nozzle supply system from the priming system during operation of the nozzle supply system, and
maintain a fluid flow path between at least one fluid reservoir and the nozzle supply system during operation of the nozzle supply system.
2. The apparatus of clause 1, wherein the priming pressure is less than about 600 kilopascals (kPa).
3. The apparatus of clause 1, wherein the first pressure is at least 6000 kPa, at least 10,000 kPA, at least 25,000 kPA, or in a range of about 6000-60,000 kPa.
4. The apparatus of clause 1, wherein, while the second fluid reservoir is being refilled with fluid target material from the priming system, the priming system and the second fluid reservoir are maintained at the priming pressure and the priming system and the second fluid reservoir are positioned relative to each other such that the second fluid reservoir is prevented from overfilling with the fluid target material.
5. The apparatus of clause 1, wherein the fluid control system is configured to, while the second fluid reservoir is being refilled with fluid target material from the priming system, maintain the fluid flow path between the first fluid reservoir and the nozzle supply system during operation of the nozzle supply system.
6. The apparatus of clause 1, wherein the fluid control system is configured to clear a target fluid material from each interface defined between the first fluid reservoir, the second fluid reservoir, the priming system, and the nozzle supply system.
7. The apparatus of clause 1, wherein the fluid control system is configured to maintain the fluid flow path between at least one fluid reservoir and the nozzle supply system during operation of the nozzle supply system by maintaining the fluid flow path between the first fluid reservoir and the nozzle supply system and between the second fluid reservoir and the nozzle supply system during operation of the nozzle supply system and while maintaining the nozzle supply system and the second fluid reservoir at the first pressure.
8. The apparatus of clause 7, wherein the fluid control system is further configured to maintain the fluid flow path between the at least one fluid reservoir and the nozzle supply system during operation of the nozzle supply system and enabling the fluid flow path between the first fluid reservoir and the second fluid reservoir.
9. The apparatus of clause 1, further comprising an environment control apparatus configured to: independently and separately control the first pressure in the first fluid reservoir and a second pressure in the second fluid reservoir, and
independently and separately control a temperature of the first fluid reservoir and a temperature of the second fluid reservoir.
10. The apparatus of clause 9, wherein the environment control apparatus is further configured to adjust or reset the second pressure of the second fluid reservoir based on a measured amount of fluid target material within the second fluid reservoir.
11. The apparatus of clause 9, wherein the environment control apparatus includes a pressurized reservoir configured to contain an inert gas and to transfer inert gas from the pressurized reservoir to one or more of the first fluid reservoir and the second fluid reservoir through an orifice.
12. The apparatus of clause 1, wherein the fluid control system includes a reservoir fluid control valve between the first fluid reservoir and the second fluid reservoir and a refill fluid control valve between the second fluid reservoir and the priming system, wherein the fluid control system is configured to independently control the reservoir fluid control valve and the refill fluid control valve.
13. The apparatus of clause 12, wherein the reservoir fluid control valve includes a freeze valve and the refill fluid control valve includes a freeze valve.
14. The apparatus of clause 1, wherein the fluid control system is further configured to maintain the fluid flow path between the first fluid reservoir and the second fluid reservoir during operation of the nozzle supply system.
15. The apparatus of clause 1, wherein the second fluid reservoir is further configured to be, at least part of the time during operation of the nozzle supply system, in fluid communication with the nozzle supply system.
16. The apparatus of clause 1, wherein the priming system comprises:
a first chamber including a door that is configured to open so that solid matter can be received within a first volume defined by the first chamber;
a second chamber defining a second volume and being in fluid communication with the fluid control system; and
a flow blocking device formed in an otherwise unobstructed fluid path between the first chamber and the second chamber.
17. The apparatus of clause 16, wherein the flow blocking device is a freeze valve in which a fluid flow path is blocked by the solid matter when maintained at a temperature below the melting point of the solid matter.
18. The apparatus of clause 1, further comprising a sensing system configured to estimate a volume of the fluid target material in one or more of the first fluid reservoir, the second fluid reservoir, and the priming system and/or a presence of solid matter within the priming system.
19. The apparatus of clause 18, further comprising a control system in communication with the sensing system, the control system being configured to determine a consumption rate of the fluid target material in the second fluid reservoir, the consumption rate being the amount of the fluid target material used per a time period, based on the output from the high pressure transducer.
20. A method for continuously supplying a target material in an uninterrupted manner, the method comprising:
receiving a solid matter that includes a target material in a priming system maintained at a priming pressure and producing a fluid target material from the solid matter;
maintaining fluid communication between a first fluid reservoir and a nozzle supply system during operation of the nozzle supply system while maintaining the first fluid reservoir at a first pressure that is greater than the priming pressure; and
at least part of the time during operation of the nozzle supply system, enabling a transfer of fluid target material between the first fluid reservoir and a second fluid reservoir at the first pressure while the fluid target material is being produced in the priming system at the priming pressure.
21. The method of clause 20, further comprising maintaining the first pressure of the first fluid reservoir while fluid target material is enabled to transfer between the priming system and the second fluid reservoir.
22. The method of clause 20, further comprising enabling a transfer of fluid target material to the nozzle supply system throughout operation of the nozzle supply system by flowing fluid target material:
from the first fluid reservoir to the nozzle supply system;
from the second fluid reservoir to the nozzle supply system; or
from the first fluid reservoir and the second fluid reservoir, simultaneously to the nozzle supply system.
23. The method of clause 20, further comprising, at least some of the time during operation of the nozzle supply system, preventing fluid target material from being transferred to the second fluid reservoir and/or the first fluid reservoir.
24. The method of clause 20, further comprising reloading solid matter that includes the target material into the priming system only when the priming system is at the priming pressure, wherein reloading solid matter that includes the target material into the priming system occurs while the nozzle supply system is at the first pressure.
25. The method of clause 20, further comprising refilling the second fluid reservoir with fluid target material from the priming system while maintaining the first pressure of the first fluid reservoir and fluidly separating the second fluid reservoir from the priming system after enough fluid target material has been transferred into the second fluid reservoir from the priming system.
26. The method of clause 25, further comprising maintaining the priming system and the second fluid reservoir at the priming pressure while the second fluid reservoir is being refilled with fluid target material from the priming system, and preventing the second fluid reservoir from overfilling with fluid target material.
27. The method of clause 20, further comprising clearing a target fluid material from each interface defined between the first fluid reservoir, the second fluid reservoir, the priming system, and the nozzle supply system prior to halting operation of the nozzle supply system and halting fluid communication between the first fluid reservoir and the nozzle supply system.
28. The method of clause 20, further comprising melting the solid matter of target material in the priming system into the target fluid material.
29. The method of clause 20, wherein operation of the nozzle supply system includes delivering droplets of the fluid target material to an extreme ultraviolet (EUV) light source, where the droplets are configured to be irradiated with radiation to create a plasma that emits EUV light.
30. A method comprising:
receiving a solid matter that includes a target material in a priming system maintained at a priming pressure and producing a fluid target material from the solid matter;
maintaining fluid communication between a first fluid reservoir and a nozzle supply system during operation of the nozzle supply system while maintaining the first fluid reservoir at a first pressure that is greater than the priming pressure; and enabling a transfer of the fluid target material between the priming system and a second fluid reservoir while fluidly isolating the first fluid reservoir and the nozzle supply system from the priming system.

31. The method of clause 30, wherein operation of the nozzle supply system includes delivering droplets of the fluid target material to an extreme ultraviolet (EUV) light source, where the droplets are configured to be irradiated with radiation to create a plasma that emits EUV light.

32. The method of clause 30, further comprising maintaining the first pressure of the first fluid reservoir while fluid target material is enabled to transfer between the priming system and the second fluid reservoir.

33. The method of clause 30, further comprising enabling a transfer of the fluid target material between the second fluid reservoir and the first fluid reservoir while fluidly isolating the first fluid reservoir, the second fluid reservoir, and the nozzle supply system from the priming system.

34. The method of clause 30, further comprising enabling a transfer of fluid target material to the nozzle supply system throughout operation of the nozzle supply system by flowing fluid target material:

from the first fluid reservoir to the nozzle supply system;
from the second fluid reservoir to the nozzle supply system; or
from the first fluid reservoir and the second fluid reservoir, simultaneously to the nozzle supply system.

35. The method of clause 30, further comprising, at least some of the time during operation of the nozzle supply system, preventing fluid target material from being transferred to the second fluid reservoir and/or the first fluid reservoir.

36. The method of clause 30, further comprising reloading solid matter that includes the target material into the priming system only when the priming system is at the priming pressure, wherein reloading solid matter that includes the target material into the priming system occurs while the nozzle supply system is at the first pressure.

37. The method of clause 30, further comprising refilling the second fluid reservoir with fluid target material from the priming system while maintaining the first pressure of the first fluid reservoir.

38. The method of clause 37, further comprising maintaining the priming system and the second fluid reservoir at the priming pressure while the second fluid reservoir is being refilled with fluid target material from the priming system, and preventing the second fluid reservoir from overfilling with fluid target material.

39. The method of clause 30, further comprising fluidly separating the second fluid reservoir from the priming system after enough fluid target material has been transferred into the second fluid reservoir from the priming system.

40. The method of clause 30, further comprising melting the solid matter of target material in the priming system into the target fluid material.

The invention claimed is:

1. An apparatus for supplying a target material, the apparatus comprising:

a first reservoir system comprising a first fluid reservoir configured to be in fluid communication with a nozzle supply system during operation of the nozzle supply system, the first fluid reservoir maintained at a first pressure;

a second reservoir system comprising a second fluid reservoir configured to be, at least part of the time during operation of the nozzle supply system, in fluid communication with the first reservoir system;

a priming system configured to receive a solid matter that includes a target material and to produce a fluid target material from the solid matter, the priming system maintained at a priming pressure that is less than the first pressure; and a fluid control system fluidly connected to the priming system, the first reservoir system, the second reservoir system, and the nozzle supply system, wherein the fluid control system is configured to:

isolate at least one fluid reservoir and the nozzle supply system from the priming system during operation of the nozzle supply system, and maintain a fluid flow path between at least one fluid reservoir and the nozzle supply system during operation of the nozzle supply system.

2. The apparatus of claim 1, wherein the priming pressure is less than about 600 kilopascals (kPa).

3. The apparatus of claim 1, wherein the first pressure is at least 6000 kPa, at least 10,000 kPA, at least 25,000 kPA, or in a range of about 6000-60,000 kPa.

4. The apparatus of claim 1, wherein, while the second fluid reservoir is being refilled with fluid target material from the priming system, the priming system and the second fluid reservoir are maintained at the priming pressure and the priming system and the second fluid reservoir are positioned relative to each other such that the second fluid reservoir is prevented from overfilling with the fluid target material.

5. The apparatus of claim 1, wherein the fluid control system is configured to, while the second fluid reservoir is being refilled with fluid target material from the priming system, maintain the fluid flow path between the first fluid reservoir and the nozzle supply system during operation of the nozzle supply system.

6. The apparatus of claim 1, wherein the fluid control system is configured to clear a target fluid material from each interface defined between the first fluid reservoir, the second fluid reservoir, the priming system, and the nozzle supply system.

7. The apparatus of claim 1, wherein the fluid control system is configured to maintain the fluid flow path between at least one fluid reservoir and the nozzle supply system during operation of the nozzle supply system by maintaining the fluid flow path between the first fluid reservoir and the nozzle supply system and between the second fluid reservoir and the nozzle supply system during operation of the nozzle supply system and while maintaining the nozzle supply system and the second fluid reservoir at the first pressure.

8. The apparatus of claim 7, wherein the fluid control system is further configured to maintain the fluid flow path between the at least one fluid reservoir and the nozzle supply system during operation of the nozzle supply system and enabling the fluid flow path between the first fluid reservoir and the second fluid reservoir.

9. The apparatus of claim 1, further comprising an environment control apparatus configured to:

independently and separately control the first pressure in the first fluid reservoir and a second pressure in the second fluid reservoir, and independently and separately control a temperature of the first fluid reservoir and a temperature of the second fluid reservoir.

10. The apparatus of claim 9, wherein the environment control apparatus is further configured to adjust or reset the second pressure of the second fluid reservoir based on a measured amount of fluid target material within the second fluid reservoir.

11. The apparatus of claim 9, wherein the environment control apparatus includes a pressurized reservoir configured to contain an inert gas and to transfer inert gas from the pressurized reservoir to one or more of the first fluid reservoir and the second fluid reservoir through an orifice.

12. The apparatus of claim 1, wherein the fluid control system includes a reservoir fluid control valve between the first fluid reservoir and the second fluid reservoir and a refill fluid control valve between the second fluid reservoir and the priming system, wherein the fluid control system is configured to independently control the reservoir fluid control valve and the refill fluid control valve.

13. The apparatus of claim 12, wherein the reservoir fluid control valve includes a freeze valve and the refill fluid control valve includes a freeze valve.

14. The apparatus of claim 1, wherein the fluid control system is further configured to maintain the fluid flow path between the first fluid reservoir and the second fluid reservoir during operation of the nozzle supply system.

15. The apparatus of claim 1, wherein the second fluid reservoir is further configured to be, at least part of the time during operation of the nozzle supply system, in fluid communication with the nozzle supply system.

16. The apparatus of claim 1, wherein the priming system comprises:
a first chamber including a door that is configured to open so that solid matter can be received within a first volume defined by the first chamber;
a second chamber defining a second volume and being in fluid communication with the fluid control system; and
a flow blocking device formed in an otherwise unobstructed fluid path between the first chamber and the second chamber.

17. The apparatus of claim 16, wherein the flow blocking device is a freeze valve in which a fluid flow path is blocked by the solid matter when maintained at a temperature below the melting point of the solid matter.

18. The apparatus of claim 1, further comprising a sensing system configured to estimate a volume of the fluid target material in one or more of the first fluid reservoir, the second fluid reservoir, and the priming system and/or a presence of solid matter within the priming system.

19. The apparatus of claim 18, further comprising a control system in communication with the sensing system, the control system being configured to determine a consumption rate of the fluid target material in the second fluid reservoir, the consumption rate being the amount of the fluid target material used per a time period, based on the output from the high pressure transducer.

20. A method for continuously supplying a target material in an uninterrupted manner, the method comprising:
receiving a solid matter that includes a target material in a priming system maintained at a priming pressure and producing a fluid target material from the solid matter;
maintaining fluid communication between a first fluid reservoir and a nozzle supply system during operation of the nozzle supply system while maintaining the first fluid reservoir at a first pressure that is greater than the priming pressure; and at least part of the time during operation of the nozzle supply system, enabling a transfer of fluid target material between the first fluid reservoir and a second fluid reservoir at the first pressure while the fluid target material is being produced in the priming system at the priming pressure.

21. The method of claim 20, further comprising maintaining the first pressure of the first fluid reservoir while fluid target material is enabled to transfer between the priming system and the second fluid reservoir.

22. The method of claim 20, further comprising enabling a transfer of fluid target material to the nozzle supply system throughout operation of the nozzle supply system by flowing fluid target material:
from the first fluid reservoir to the nozzle supply system;
from the second fluid reservoir to the nozzle supply system; or
from the first fluid reservoir and the second fluid reservoir, simultaneously to the nozzle supply system.

23. The method of claim 20, further comprising, at least some of the time during operation of the nozzle supply system, preventing fluid target material from being transferred to the second fluid reservoir and/or the first fluid reservoir.

24. The method of claim 20, further comprising reloading solid matter that includes the target material into the priming system only when the priming system is at the priming pressure, wherein reloading solid matter that includes the target material into the priming system occurs while the nozzle supply system is at the first pressure.

25. The method of claim 20, further comprising refilling the second fluid reservoir with fluid target material from the priming system while maintaining the first pressure of the first fluid reservoir and fluidly separating the second fluid reservoir from the priming system after enough fluid target material has been transferred into the second fluid reservoir from the priming system.

26. The method of claim 25, further comprising maintaining the priming system and the second fluid reservoir at the priming pressure while the second fluid reservoir is being refilled with fluid target material from the priming system, and preventing the second fluid reservoir from overfilling with fluid target material.

27. The method of claim 20, further comprising clearing a target fluid material from each interface defined between the first fluid reservoir, the second fluid reservoir, the priming system, and the nozzle supply system prior to halting operation of the nozzle supply system and halting fluid communication between the first fluid reservoir and the nozzle supply system.

28. The method of claim 20, further comprising melting the solid matter of target material in the priming system into the target fluid material.

29. The method of claim 20, wherein operation of the nozzle supply system includes delivering droplets of the fluid target material to an extreme ultraviolet (EUV) light source, where the droplets are configured to be irradiated with radiation to create a plasma that emits EUV light.

30. A method comprising:
receiving a solid matter that includes a target material in a priming system maintained at a priming pressure and producing a fluid target material from the solid matter;
maintaining fluid communication between a first fluid reservoir and a nozzle supply system during operation of the nozzle supply system while maintaining the first fluid reservoir at a first pressure that is greater than the priming pressure; and enabling a transfer of the fluid target material between the priming system and a second fluid reservoir while fluidly isolating the first fluid reservoir and the nozzle supply system from the priming system.

31. The method of claim 30, wherein operation of the nozzle supply system includes delivering droplets of the fluid target material to an extreme ultraviolet (EUV) light source, where the droplets are configured to be irradiated with radiation to create a plasma that emits EUV light.

32. The method of claim 30, further comprising maintaining the first pressure of the first fluid reservoir while fluid target material is enabled to transfer between the priming system and the second fluid reservoir.

33. The method of claim 30, further comprising enabling a transfer of the fluid target material between the second fluid reservoir and the first fluid reservoir while fluidly isolating the first fluid reservoir, the second fluid reservoir, and the nozzle supply system from the priming system.

34. The method of claim 30, further comprising enabling a transfer of fluid target material to the nozzle supply system throughout operation of the nozzle supply system by flowing fluid target material:
from the first fluid reservoir to the nozzle supply system;
from the second fluid reservoir to the nozzle supply system; or
from the first fluid reservoir and the second fluid reservoir, simultaneously to the nozzle supply system.

35. The method of claim 30, further comprising, at least some of the time during operation of the nozzle supply system, preventing fluid target material from being transferred to the second fluid reservoir and/or the first fluid reservoir.

36. The method of claim 30, further comprising reloading solid matter that includes the target material into the priming system only when the priming system is at the priming pressure, wherein reloading solid matter that includes the target material into the priming system occurs while the nozzle supply system is at the first pressure.

37. The method of claim 30, further comprising refilling the second fluid reservoir with fluid target material from the priming system while maintaining the first pressure of the first fluid reservoir.

38. The method of claim 37, further comprising maintaining the priming system and the second fluid reservoir at the priming pressure while the second fluid reservoir is being refilled with fluid target material from the priming system, and preventing the second fluid reservoir from overfilling with fluid target material.

39. The method of claim 30, further comprising fluidly separating the second fluid reservoir from the priming system after enough fluid target material has been transferred into the second fluid reservoir from the priming system.

40. The method of claim 30, further comprising melting the solid matter of target material in the priming system into the target fluid material.

* * * * *